US010718038B2

United States Patent
Noujima et al.

(10) Patent No.: US 10,718,038 B2
(45) Date of Patent: *Jul. 21, 2020

(54) TWO-PHASE ALLOY, PRODUCT USING SAID TWO-PHASE ALLOY, AND METHOD FOR PRODUCING SAID PRODUCT

(71) Applicant: HITACHI, LTD., Tokyo (JP)

(72) Inventors: Masafumi Noujima, Tokyo (JP); Yasuhisa Aono, Tokyo (JP); Naoya Okizaki, Tokyo (JP); Yusaku Maruno, Tokyo (JP); Tomonori Kimura, Tokyo (JP); Makoto Ogata, Tokyo (JP)

(73) Assignee: HITACHI, LTD., Tokyo (JP)

( * ) Notice: Subject to any disclaimer, the term of this patent is extended or adjusted under 35 U.S.C. 154(b) by 331 days.

This patent is subject to a terminal disclaimer.

(21) Appl. No.: 15/510,322

(22) PCT Filed: Sep. 28, 2015

(86) PCT No.: PCT/JP2015/077398
§ 371 (c)(1),
(2) Date: Mar. 10, 2017

(87) PCT Pub. No.: WO2016/052445
PCT Pub. Date: Apr. 7, 2016

(65) Prior Publication Data
US 2017/0292175 A1    Oct. 12, 2017

(30) Foreign Application Priority Data
Sep. 29, 2014    (JP) ................................. 2014-198879

(51) Int. Cl.
*C22C 27/06* (2006.01)
*C22C 30/00* (2006.01)
(Continued)

(52) U.S. Cl.
CPC ................ *C22C 30/00* (2013.01); *B22F 9/00* (2013.01); *B22F 9/02* (2013.01); *B22F 9/06* (2013.01);
(Continued)

(58) Field of Classification Search
CPC ..... C22C 45/006; C22C 45/008; C22C 45/02; C22C 19/05; C22C 19/052; C22C 19/053;
(Continued)

(56) References Cited

U.S. PATENT DOCUMENTS

| 5,387,292 A | 2/1995 | Morishige et al. | |
|---|---|---|---|
| 2019/0071754 A1* | 3/2019 | Kimura | B22D 21/02 |
| 2019/0100825 A1* | 4/2019 | Kimura | B22D 21/02 |

FOREIGN PATENT DOCUMENTS

| JP | 50-133114 A | 10/1975 |
|---|---|---|
| JP | 60-180692 A | 9/1985 |

(Continued)

OTHER PUBLICATIONS

Machine Translation, Yukimoto Masao, et al., JP 03-114693, May 1991. (Year: 1991).*

(Continued)

*Primary Examiner* — Michael E. La Villa
(74) *Attorney, Agent, or Firm* — Volpe and Koenig, P.C.

(57) ABSTRACT

An object of the invention is to provide: a two-phase alloy as a metal material that can be preferably utilized under circumstances of a temperature range and a high corrosion as in an oil well, the two-phase alloy having a high corrosion resistance and good mechanical properties that are equivalent or more than those of conventional ones, and saving a cost; a product of the two-phase alloy; and a method for producing the product. There is provided a two-phase alloy containing Cr as a major component and including two phases of an austenite phase and a ferrite phase in a mixed (Continued)

state. The alloy has a chemical composition containing: 34-70 mass % of Cr; 17-45 mass % of Ni; 10-35 mass % of Fe; 0.1-2 mass % of Mn; 0.1-1 mass % of Si; and impurities. The total content of the Ni and the Fe is 30-65 mass %.

20 Claims, 7 Drawing Sheets

(51) Int. Cl.
| | |
|---|---|
| C22F 1/00 | (2006.01) |
| C22F 1/11 | (2006.01) |
| C22C 38/18 | (2006.01) |
| C22C 19/05 | (2006.01) |
| C22C 38/40 | (2006.01) |
| C22C 45/00 | (2006.01) |
| C22C 45/02 | (2006.01) |
| H05K 3/10 | (2006.01) |
| H05K 3/12 | (2006.01) |
| C09C 1/62 | (2006.01) |
| C21D 1/02 | (2006.01) |
| C21D 1/00 | (2006.01) |
| C21D 8/12 | (2006.01) |
| C21D 8/00 | (2006.01) |
| C22C 1/10 | (2006.01) |
| B22F 9/08 | (2006.01) |
| B22F 9/06 | (2006.01) |
| B22F 9/02 | (2006.01) |
| B22F 9/00 | (2006.01) |
| B21B 3/00 | (2006.01) |

(52) U.S. Cl.
CPC ................ *B22F 9/08* (2013.01); *C09C 1/62* (2013.01); *C09C 1/622* (2013.01); *C21D 1/00* (2013.01); *C21D 1/02* (2013.01); *C21D 8/00* (2013.01); *C21D 8/1244* (2013.01); *C22C 1/1042* (2013.01); *C22C 19/05* (2013.01); *C22C 19/052* (2013.01); *C22C 19/053* (2013.01); *C22C 27/06* (2013.01); *C22C 38/18* (2013.01); *C22C 38/40* (2013.01); *C22C 45/006* (2013.01); *C22C 45/008* (2013.01); *C22C 45/02* (2013.01); *C22F 1/00* (2013.01); *C22F 1/11* (2013.01); *H05K 3/102* (2013.01); *H05K 3/12* (2013.01); *B21B 2003/006* (2013.01); *B22F 2302/00* (2013.01); *B22F 2303/00* (2013.01); *C21D 2211/00* (2013.01); *C21D 2211/001* (2013.01); *C21D 2211/005* (2013.01); *H05K 2203/0425* (2013.01); *Y10S 75/00* (2013.01); *Y10S 75/956* (2013.01); *Y10S 977/777* (2013.01); *Y10T 428/12847* (2015.01); *Y10T 428/12854* (2015.01); *Y10T 428/12931* (2015.01); *Y10T 428/12944* (2015.01); *Y10T 428/12951* (2015.01); *Y10T 428/24372* (2015.01); *Y10T 428/24413* (2015.01)

(58) Field of Classification Search
CPC ......... C22C 38/18; C22C 38/40; C22C 27/06; C22C 30/00; C22C 1/1042; C22F 1/11; C22F 1/00; Y10S 75/00; Y10S 75/956; Y10S 977/777; H05K 2203/0425; H05K 3/12; H05K 3/102; B21B 2003/006; B22F 2303/00; B22F 2302/00; B22F 9/08; B22F 9/06; B22F 9/02; B22F 9/00; C09C 1/62; C09C 1/622; Y10T 428/24372; Y10T 428/24413; Y10T 428/12847; Y10T 428/12854; Y10T 428/12931; Y10T 428/12944; Y10T 428/12951; C21D 8/00; C21D 8/1244; C21D 1/00; C21D 1/02; C21D 2211/00; C21D 2211/001; C21D 2211/005

See application file for complete search history.

(56) References Cited

FOREIGN PATENT DOCUMENTS

| | | | |
|---|---|---|---|
| JP | 62-260037 A | | 11/1987 |
| JP | 03-064404 A | | 3/1991 |
| JP | 03-068737 A | | 3/1991 |
| JP | 03-114693 | * | 5/1991 |
| JP | 04-301048 A | | 10/1992 |
| JP | 04-301049 A | | 10/1992 |
| JP | 07-258801 A | | 10/1995 |
| JP | 8267275 A | | 10/1996 |
| JP | 08-291355 A | | 11/1996 |
| JP | 09-122957 A | | 5/1997 |
| JP | 2006-152412 A | | 6/2006 |
| WO | WO 2017/037851 | * | 3/2017 |

OTHER PUBLICATIONS

Machine Translation, Kimura, et al., WO 2017/037851, Mar. 2017. (Year: 2017).*
Machine Translation, Asakawa et al., JP 60-180692, Sep. 1985. (Year: 1985).*
Machine Translation, Kitani, JP 09-122957, May 1997. (Year: 1997).*
Extended European Search Report dated Apr. 6, 2018 for the European Patent Application No. 15845890.1.
International Search Report, PCT/JP2015/077398, dated Dec. 22, 2015, 2 pgs.

* cited by examiner

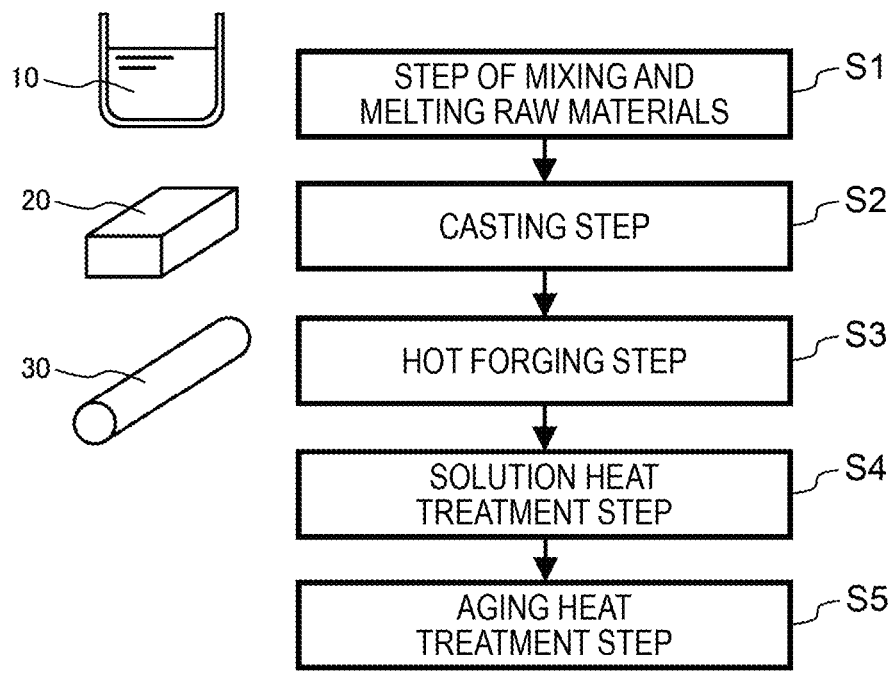
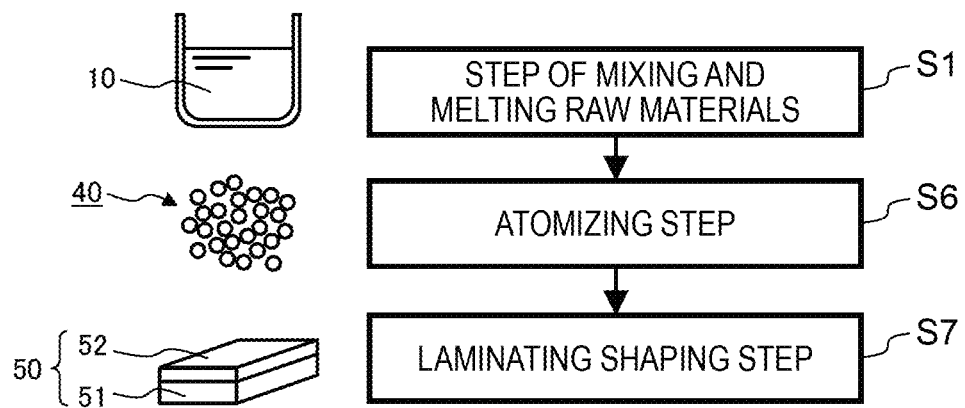

TWO-PHASE ALLOY, PRODUCT USING SAID TWO-PHASE ALLOY, AND METHOD FOR PRODUCING SAID PRODUCT

TECHNICAL FIELD OF THE INVENTION

The present invention relates to a technology for a high corrosion resistance and high mechanical strength alloy, and specifically relates to a two-phase alloy containing two phases of an austenite phase and a ferrite phase in a mixed state, a product of the two-phase alloy, and a method for producing the product.

DESCRIPTION OF BACKGROUND ART

As a material for apparatus for oil wells for use in the boring of crude oil, natural gas and the like, carbon steel and a corrosion suppressing agent (an inhibitor) were generally used in combination in the past. In recent years, due to the change in boring circumstances in accordance with the development of increasing of depth in oil well boring, higher corrosion resistance and mechanical properties (e.g., hardness) than before have been gradually required in materials for apparatus for use in oil wells, and thus steel materials having excellent corrosion resistance (alloy steels) have been used. For example, since the corrosion resistance of iron (Fe) is significantly improved by adding chromium (Cr), many martensitic stainless steels (e.g., SUS 420) containing 13% by mass of Cr have been used in oil wells containing metal corrosive components.

However, SUS 420 has a disadvantage that it easily causes stress corrosion cracking (SCC) under a circumstance containing a chloride and an acidic gas (e.g., carbon dioxide gas and hydrogen sulfide). Therefore, in the case when oil well boring is conducted under such hard corrosion circumstance, expensive nickel (Ni) based alloys (e.g., an alloy containing 40% by mass or more of Ni) have been conventionally used in many cases, and thus there was a problem that the material cost (eventually boring cost) significantly increased.

On the other hand, Cr based alloys are exemplified as corrosion resistant, heat-resistant alloys that are more inexpensive than Ni based alloys, and various Cr based alloys have been proposed. For example, PTL 1 (JP H04-301048 A) discloses a Cr—Fe-based heat-resistant alloy having a chemical composition including Cr: 65 to 80%, Co: 10 to 15%, Fe and impurities as a balance, and including N: 0.1 to 1.5% as necessary. PTL 2 (JP H04-301049 A) discloses a heat-resistant alloy having a chemical composition including Cr: 70 to 95%, N: 0.1 to 1.5%, Fe and impurities as a balance. According to PTLs 1 and 2, the alloys are deemed to be excellent in compression deformation resistance, oxidation resistance and the like in a high temperature atmosphere furnace, and thus significantly contribute to improvement of durability as a supporting surface member for a steel material to be heated, and decreasing of maintenance and accompanying improvement of a furnace operation efficiency.

PTL 3 (JP H08-291355 A) discloses a Cr based heat-resistant alloy containing, by mass %, Cr: more than 95% and N: 0.1 to 2.0%, as a balance, one kind or two or more kinds of Fe, Ni and Co, and unavoidable impurities, and further containing, as necessary, one kind or two or more kinds of Ti, Al, Zr, Nb, B and V by 0.3% or more in total. According to PTL 3, it is deemed that a Cr based heat-resistant alloy having an excellent high temperature strength, which is used in members for which strength, ductility and corrosion resistance are required under a ultra-high temperature (e.g., a supporting member for a steel material to be heated in a heating furnace) can be provided.

Furthermore, PTL 4 (JP H07-258801 A) discloses an Fe—Cr—Ni alloy including Cr: 15 to 50%, Ni: 6.1 to 50%, O+P+S: 200 ppm or less, and Fe and unavoidable impurities as a balance, having a crystal particle size number: 8 or more, and containing C+N: 400 to 1,200 ppm as necessary, which gives excellent corrosion resistance to processed parts. According to PTL 4, it is deemed that an Fe—Cr—Ni alloy that improves corrosion resistance without decreasing processability, and does not decrease corrosion resistance even being processed, can be provided.

CITATION LIST

Patent Literature

PTL 1: JP H04-301048 A;
PTL 2: JP H04-301049 A;
PTL 3: JP H08-291355 A; and
PTL 4: JP H07-258801 A.

SUMMARY OF THE INVENTION

Problems to be Solved by the Invention

The high Cr based alloys as described in PTLs 1 to 3 (alloys containing Cr at a high content) are intended to be used under high temperature circumstances at 1,300° C. or more, and are deemed to have excellent corrosion resistance and mechanical properties even under such high temperature circumstances. However, such high Cr based alloys show brittleness at temperature ranges of oil well circumstances (room temperature to about 300° C.) (the toughness is insufficient), and thus are considered to be unsuitable as materials for apparatus for use in oil wells.

Furthermore, the Fe—Cr—Ni alloy described in PTL 4 intends an austenitic stainless steel, but it is known that an austenitic stainless steel easily causes stress corrosion cracking (SCC) by hydrogen brittleness under a high temperature-high pressure circumstance containing a chloride, and this is considered to be not suitable as a material for apparatus for use in oil wells, as in high Cr based alloys.

As mentioned before, due to the advancement of increasing of depth in oil well boring, a metal material having high corrosion resistance and high mechanical properties that are equal to or more than those of conventional metal materials, and requiring a lower cost than that of an Ni based alloy is strongly demanded.

Accordingly, it is an objective of the present invention to provide a two-phase alloy as a metal material that can be preferably utilized under circumstances of a temperature range and a high corrosion as in an oil well, the two-phase alloy having a high corrosion resistance and good mechanical properties that are equivalent or more than those of conventional ones, and saving a cost. Also, another objective of the invention is to provide a product of the two-phase alloy, and a method for producing the product.

Solution to Problems (I) According to one aspect of the present invention, there is provided a two-phase alloy containing Cr (chromium) as a major component and including two phases of an austenite phase and a ferrite phase in a mixed state. The two-phase alloy has a chemical composition containing: 34% by mass or more and 70% by mass or less of Cr; 17% by mass or more and 45% by mass or less of Ni (nickel); 10% by mass or more and 35% by mass or less of Fe (iron); 0.1% by mass or more and 2% by mass or less of Mn (manganese); 0.1% by mass or more and 1% by mass or less of Si (silicon); and impurities. Furthermore, the total content of the Ni and the Fe is 30% by mass or more and 65% by mass or less.

In the above two-phase alloy (I) of the invention, the following modifications and changes can be made.

(i) The impurities comprises: more than 0% by mass and 0.03% by mass or less of C (carbon); more than 0% by mass and 0.02% by mass or less of N (nitride); more than 0% by mass and 0.03% by mass or less of O (oxygen). The chemical composition further comprises at least one of V (vanadium), Nb (niobium), Ta (tantalum) and Ti (titanium) as the constitutional component(s) of the two-phase alloy. Furthermore, the total content of the V, Nb, Ta and Ti is in the range of 0.8 times or more and 2 times or less of the total content of the C, N and O.

(ii) The impurities further comprise: more than 0% by mass and 0.04% by mass or less of P (phosphorus); and more than 0% by mass and 0.01% by mass or less of S (sulfur).

(iii) The ferrite phase has an occupation ratio of 10% or more and 90% or less.

(II) According to another aspect of the present invention, there is provided a product using a two-phase alloy, in which the two-phase alloy is the above-mentioned two-phase alloy.

In the above two-phase alloy product (II) of the invention, the following modifications and changes can be made.

(iv) The product is a shaped body having a forged microstructure.

(v) The product is a composite having a substrate and a coating layer of the two-phase alloy formed on the substrate.

(vi) The ratio of an average Cr concentration in the austenite phase to an average Cr concentration of the ferrite phase in the coating layer is 1.3 or less.

(vii) The coating layer has a quench-solidified microstructure.

(viii) The product is a shaft or a bearing of a rotary machine.

(ix) The product is a powder.

(x) The product is a rod or a wire.

(xi) The product is a welding material.

(xii) The product is a welded joint having alloy members that are welded through a welded part, and the welded part is formed of the two-phase alloy.

(xiii) The ratio of an average Cr concentration in the austenite phase to an average Cr concentration of the ferrite phase in the welded part is 1.3 or less.

(xiv) The alloy member is formed of the two-phase alloy.

(III) According to still another aspect of the present invention, there is provided a method for producing the two-phase alloy product, including:

a step of mixing and melting raw materials, in which raw materials are mixed and melted;

a casting step, in which an ingot is formed by casting;

a hot forging step, in which the ingot is subjected to hot forging to form a shaped body; and a solution heat treatment step, in which the shaped body is subjected to a solution treatment within a temperature range of 1,050° C. or more and 1,250° C. or less.

In the above method for producing the two-phase alloy product (III) of the invention, the following modifications and changes can be made.

(xv) The method further includes, after the solution heat treatment step, an aging heat treatment step, in which the shaped body that has undergone the solution treatment is subjected to an aging treatment within a temperature range of 800° C. or more and 1,000° C. or less.

(IV) According to still another aspect of the present invention, there is provided a method for producing the two-phase alloy product, including:

a step of mixing and melting raw materials, in which raw materials of the two-phase alloy are mixed and melted to form a molten metal;

an atomizing step, in which an alloy powder is formed from the molten metal; and a laminating shaping step, in which a coating layer of the two-phase alloy is formed on the substrate by using the alloy powder.

(V) According to still another aspect of the present invention, there is provided a method for producing the two-phase alloy product, including:

a step of mixing and melting raw materials, in which raw materials of the two-phase alloy are mixed and melted;

a casting step for forming an ingot by casting;

a hot working step, in which the ingot is subjected to hot working to form a rod or a wire; and a welding step, in which the alloy members are welded by using the rod or the wire as a welding material.

Advantages of the Invention

According to the present invention, there can be provided a two-phase alloy as a metal material that can be preferably utilized under circumstances of a temperature range and high corrosion as in an oil well, the two-phase alloy having high corrosion resistance and good mechanical properties that are equivalent or more than those of conventional ones, and saving a cost. Furthermore, a product of the two-phase alloy and a method for producing the product can be provided.

BRIEF DESCRIPTION OF THE DRAWINGS

FIG. 2 is an exemplary operation flowchart showing a method for producing the two-phase alloy product according to the invention;

FIG. 3 is another exemplary operation flowchart showing a method for producing the two-phase alloy product according to the invention;

DETAILED DESCRIPTION OF THE PREFERRED EMBODIMENTS

Figure 1:
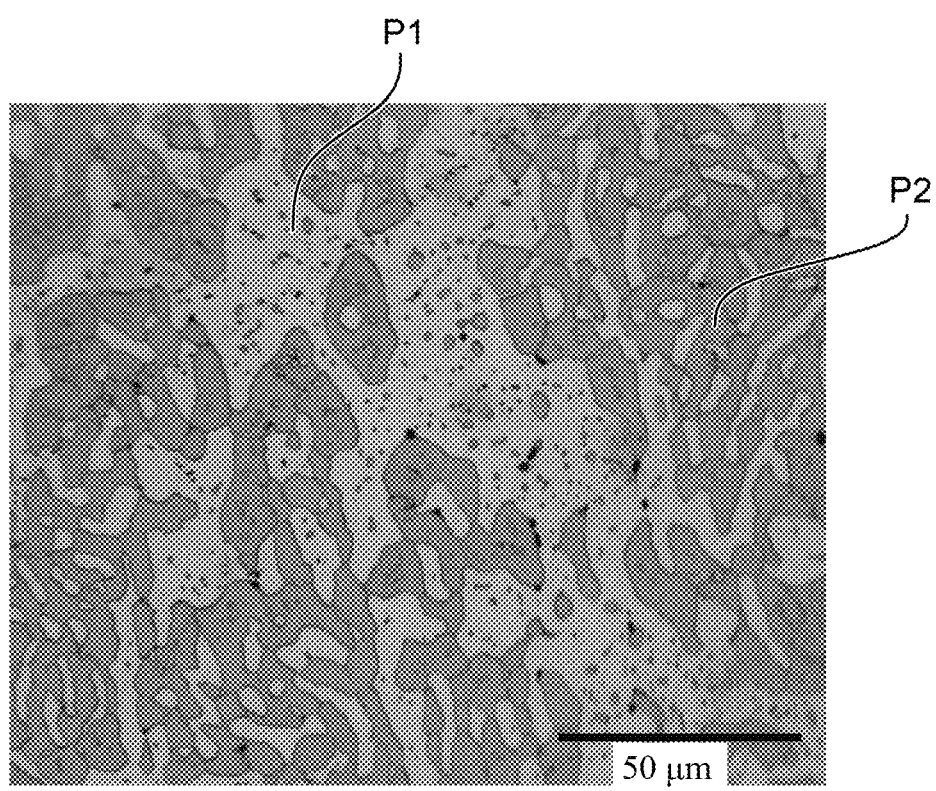
FIG. 1 is an exemplary optical microscope photograph showing a metal microstructure of a sample of the two-phase alloy material according to the present invention, the sample having undergone hot forging and then undergone a solution heat treatment.

The inventors did intensive research and discussion, in a Cr—Ni—Fe based alloy containing Cr as a major component, specifically in a Cr—Ni—Fe based alloy containing 34% by mass or more of Cr, as to relationships among a composition, a metal microstructure, a product using the alloy, mechanical properties, and a corrosion resistance, thereby completed the present invention.

Hereinafter, preferred embodiments of the invention will be described in detail with reference to the drawings. However, the invention is not limited to the specific embodiments given herein, and can be suitably combined and improved within a scope that does not depart from a technical concept of the invention.

(Metal Microstructure of Two-Phase Alloy of Invention)

First, a metal microstructure of a two-phase alloy according to the present invention is described.

An alloy of the invention is a Cr—Ni—Fe based alloy containing Cr, Ni and Fe as major components. A metal microstructure of an alloy containing Fe as a major component is generally roughly classified into: a ferrite microstructure having a body-centered cubic crystalline structure (also referred to as a ferrite phase or an α phase); an austenite microstructure having a face-centered cubic crystalline structure (also referred to as an austenite phase or a γ phase); and a martensite microstructure having a strained body-centered cubic crystalline structure (also referred to as a martensite phase or an α' phase).

It is known that a ferrite phase is excellent in corrosion resistance (e.g., SCC resistance) and has a high mechanical strength (e.g., 0.2% yield strength), but has relatively lower ductility and toughness than those of an austenite phase. It is known that an austenite phase has relatively higher ductility and toughness but relatively lower mechanical strength than those of a ferrite phase. Furthermore, it is known that the austenite phase exhibits high corrosion resistance under a general circumstance, but the SCC resistance quickly decreases when the corrosion circumstance becomes strict. Also, it is known that a martensite phase has a high mechanical strength (e.g., hardness) but has a relatively low corrosion resistance.

On the other hand, a two-phase alloy according to the invention is an alloy in which two phases of an austenite phase and a ferrite phase are present in a mixed state as a metal microstructure. The two-phase alloy has a characteristic that it has advantages of the austenite phase (excellent ductility and toughness) and advantages of the ferrite phase (high mechanical strength, and excellent corrosion resistance including SCC resistance) in combination. Furthermore, the two-phase alloy contains Cr, which is more inexpensive than Ni, as a major component, and thus has an advantage that the material cost can be decreased more than in an Ni based alloy containing Ni as the maximum.

It is preferable that the two-phase alloy of the invention is such that the ferrite phase has an occupation ratio (hereinafter sometimes simply referred to as "ferrite ratio") is 10% or more and 90% or less, and the remnant is an austenite phase. The occupation ratio of a phase in the invention is defined as the content (unit: %) of the phase when an electron backscatter pattern (EBSP) analysis is conducted on a polished surface of an alloy bulk sample.

When the ferrite ratio is out of the range of 10% or more and 90% or less, advantages of a two-phase alloy are obtained little (a weakpoint of a single austenite phase or a weakpoint of a single ferrite phase clearly appears). The ferrite ratio is more preferably 20% or more and 70% or less, further preferably 30% or more and 70% or less.

Furthermore, it is preferable that a product formed of the two-phase alloy of the invention has a metal microstructure consisting of smaller crystal grains (e.g., a forged microstructure, a quench-solidified microstructure) in view of mechanical properties and corrosion resistance. In other words, it is preferable that the product is molded and formed by using the two-phase alloy of the invention by means of forging or quenching solidification. By having a metal microstructure consisting of smaller crystal grains, better mechanical properties and corrosion resistance than those of a cast-solidified microstructure consisting of coarse crystal grains can be obtained. The metal microstructure may be a metal microstructure that has undergone a solution heat treatment after forging or quench solidification, or may be a metal microstructure that has further undergone an aging heat treatment.

FIG. 1 is an exemplary optical microscope photograph showing a metal microstructure of a sample of the two-phase alloy material according to the invention, the sample having undergone hot forging and then undergone a solution heat treatment. As shown in FIG. 1, it is confirmed that the two-phase alloy according to the invention has a metal microstructure in which an austenite phase P1 exhibiting a bright color and a ferrite phase P2 exhibiting a dark color are dispersed and mixed with each other. Furthermore, since hot forging has been conducted, it is confirmed that the two-phase alloy has a microstructure in which a cast solidified microstructure (for example, a dendritic crystal that is inherent to a cast solidified microstructure) has been broken and in which crystal grains showing equiaxed crystals are seen in at least a part (so-called a forged microstructure). The other details will be described later.

(Composition of Two-Phase Alloy of Invention)

As mentioned above, the two-phase alloy according to the invention is a Cr—Ni—Fe based alloy containing Cr, Ni and Fe as major components. Furthermore, the two-phase alloy contains at least Mn and Si as accessory components, further contains impurities, and optionally contains at least one kind of V, Nb, Ta and Ti. The chemical composition (respective components) of the two-phase alloy according to the invention will be described below.

Cr: 34 to 70% by Mass

The Cr component is one of the major components of this two-phase alloy, and is a component that forms a high strength ferrite phase. Furthermore, the Cr component is dissolved in the austenite phase to thereby contribute to the improvement of the corrosion resistance. The content ratio of the Cr component is preferably 34% by mass or more and 70% by mass or less, more preferably 34% by mass or more and 65% by mass or less, and further preferably 40% by mass or more and 60% by mass or less. When the Cr content ratio becomes lower than 34% by mass, the ferrite ratio becomes lower than 10% (the occupation ratio of the austenite phase is more than 90%), and the mechanical strength of the two-phase alloy decreases. On the other hand, when the Cr content ratio is more than 70% by mass, the ferrite ratio becomes more than 90% (the occupation ratio of the austenite phase becomes lower than 10%), and the ductility and toughness of the two-phase alloy decrease. Moreover, in view of the corrosion resistance and material costs, it is preferable that the Cr component has the maximum content among the major three components (Cr, Ni and Fe).

Ni: 17 to 45% by Mass

The Ni component is one of the major components of this two-phase alloy, and is a component that stabilizes the austenite phase to thereby contribute to the preservation of the two-phase state of the alloy (for example, the two-phase state can be preserved even after undergoing a solution treatment) and impart the ductility and toughness to the two-phase alloy. The content ratio of the Ni component is preferably 17% by mass or more and 45% by mass or less, more preferably 20% by mass or more and 40% by mass or less. When the Ni content ratio becomes lower than 17% by mass, the occupation ratio of the austenite phase becomes lower than 10% (the ferrite ratio goes beyond 90%), and thus the ductility and toughness of the two-phase alloy decrease. On the other hand, when the Ni content ratio goes beyond 45% by mass, the ferrite ratio becomes lower than 10% (the occupation ratio of the austenite phase goes beyond 90%), and thus the mechanical strength of the two-phase alloy decreases.

Fe: 10 to 35% by Mass

The Fe component is also one of the major components of this two-phase alloy, and is an elemental component for ensuring the mechanical strength. The content ratio of the Fe component is preferably 10% by mass or more and 35% by mass or less, more preferably 10% by mass or more and 32% by mass or less. When the Fe content ratio becomes lower than 10% by mass, the ductility and toughness of the two-phase alloy decrease. On the other hand, when the Fe content ratio becomes more than 35% by mass, a $\sigma$ phase of an intermetallic compound is prone to generate at a temperature range around 800° C., and thus the ductility and toughness of the two-phase alloy significantly decrease (so-called a $\sigma$ phase brittleness). In other words, by controlling the Fe content ratio to be in the range of 10 to 35% by mass, the generation of the $\sigma$ phase can be suppressed while ensuring the mechanical strength of the two-phase alloy, whereby decrease in the ductility and toughness can be suppressed.

Ni+Fe: 30 to 65% by Mass

The total content ratio of the Ni component and the Fe component is preferably 30% by mass or more and 65% by mass or less, more preferably 40% by mass or more and 62% by mass or less, further preferably 45% by mass or more and 55% by mass or less. When the total content ratio becomes lower than 30% by mass, the ductility and toughness of the two-phase alloy become insufficient. On the other hand, when the total content ratio becomes more than 65% by mass, the mechanical strength significantly decreases.

Mn: 0.1 to 2% by Mass

The Mn component is an accessory component that plays a role of desulfurization and deoxidation in this two-phase alloy to thereby contribute to the improvement of mechanical strength and toughness, and to the improvement of resistance against corrosion with carbon dioxide. The content ratio of the Mn component is preferably 0.1% by mass or more and 2% by mass or less, more preferably 0.3% by mass or more and 1.8% by mass or less. When the Mn content ratio becomes lower than 0.1% by mass, the effects by the Mn component cannot be sufficiently obtained. On the other hand, when the Mn content ratio becomes more than 2% by mass, coarse particles of a sulfide (e.g., MnS) are prone to form, and cause deterioration in the corrosion resistance and mechanical strength.

Si: 0.1 to 1% by Mass

The Si component is an accessory component that plays a role of deoxidation, and thus contributes to the improvement of mechanical strength and toughness in this two-phase alloy. The content ratio of the Si component is preferably 0.1% by mass or more and 1% by mass or less, more preferably 0.3% by mass or more and 0.8% by mass or less. When the Si content ratio becomes lower than 0.1% by mass, the effects by the Si component cannot be sufficiently obtained. On the other hand, when the Si content ratio goes beyond 1% by mass, coarse particles of an oxide (e.g., $SiO_2$) are prone to form, and cause decrease in the toughness.

Impurities

The impurities in this two-phase alloy include P, S, C, N and O. Those impurities will be described below.

P: More than 0% by Mass and 0.04% by Mass or Less

The P component is an impurity component that is prone to segregate at the crystal grain boundaries of the two-phase alloy to thereby decrease the toughness of the alloy and the corrosion resistance of the grain boundaries. By controlling the content ratio of the P component to be 0.04% by mass or less, those negative effects can be suppressed. The P content ratio is more preferably 0.03% by mass or less.

S: More than 0% by Mass and 0.01% by Mass or Less

The S component is an impurity component that is prone to form a sulfide having a relatively low melting point (e.g., an Fe sulfide) by chemically reacting with the constitutional components of this two-phase alloy to thereby decrease the toughness and pitting resistance of the alloy. Those negative effects can be suppressed by controlling the content ratio of the S component to 0.01% by mass or less. The S content ratio is more preferably 0.003% by mass or less.

C: More than 0% by Mass and 0.03% by Mass or Less

The C component has an effect to harden the alloy by solid-solution, but is also an impurity component that is prone to produce a carbide (e.g., a Cr carbide) by chemically reacting with the constitutional components of this two-phase alloy. The Cr carbide easily precipitates at the grain boundaries to thereby decrease the corrosion resistance and toughness of the alloy. Those negative effects can be suppressed by controlling the content ratio of the C component to be 0.03% by mass or less. The C content ratio is more preferably 0.02% by mass or less.

N: More than 0% by Mass and 0.02% by Mass or Less

The N component has an effect to harden the alloy by solid-solution, but is also an impurity component that is prone to produce a nitride (e.g., a Cr nitride) by chemically reacting with the constitutional components of this two-phase alloy. The precipitation of the Cr nitride causes to decrease the toughness of the alloy. The negative effect can be suppressed by controlling the content ratio of the N component to be 0.02% by mass or less. The N content ratio is more preferably 0.015% by mass or less.

O: More than 0% by Mass and 0.03% by Mass or Less

The O component is an impurity component that is prone to form and precipitate an oxide (e.g., an Fe oxide) by chemically reacting with the constitutional components of this two-phase alloy to thereby decrease the toughness of the alloy. The negative effect can be suppressed by controlling the content ratio of the O component to be 0.03% by mass or less. The O content ratio is more preferably 0.02% by mass or less.

Optional Accessory Components

It is preferable that this two-phase alloy further contains at least one kind of V, Nb, Ta and Ti as optional accessory components. These optional accessory components will be described below.

The V component, Nb component, Ta component and Ti component are each a component that plays a role of decarbonation, denitration and deoxidation in this two-phase alloy. By forming compounds of C, N and O with the impurity components to thereby collect and stabilize the impurity components, the toughness of the alloy can be improved (decrease in toughness can be suppressed).

Furthermore, addition of a small amount of the V component gives a secondary effect to improve the mechanical properties (e.g., hardness and tensile strength) of the alloy. Addition of a small amount of the Nb component also gives a secondary effect to improve the mechanical properties (e.g., toughness) of the alloy. Addition of small amounts of the Ta component and Ti component provides a secondary effect to improve the corrosion resistance of the alloy.

It is preferable that the total content ratio of the above-mentioned optional accessory components is controlled to be within the range of 0.8 times or more and 2 times or less of the total content ratio of the C, N and O in the impurity components. When the total content ratio of the optional accessory components becomes lower than 0.8 times of the total content ratio of C, N and O, the above-mentioned effects cannot be sufficiently obtained. On the other hand, when the total content ratio of the optional accessory components becomes more than two times of the total content ratio of the C, N and O, the ductility and toughness of the alloy decrease.

(Two-Phase Alloy Product of Invention, and Method for Producing Product)

Hereinafter, a product using the above-mentioned two-phase alloy, and a method for producing the product will be explained. FIG. 2 is an exemplary operation flowchart showing a method for producing the two-phase alloy product according to the invention.

As shown in FIG. 2, in this production method, firstly, a step for mixing and melting raw materials (Step 1: S1), in which raw materials of the two-phase alloy are mixed and melted so as to have a desired chemical composition (major components+accessory components+optional accessory components as necessary) to thereby form a molten metal 10, is conducted. The methods for mixing and melting the raw materials are not specifically limited, and a conventional method in the production of an alloy having high corrosion resistance and high mechanical strength can be utilized. For example, a vacuum melting method can be preferably utilized as the melting method. Furthermore, it is preferable to refine the molten metal 10 by using a vacuum carbon deoxidation method or the like in combination.

Subsequently, a casting step, in which the molten metal 10 is cast into a predetermined mold, is conducted (Step 2: S2). Meanwhile, in the case when high cooling rate, at which coarsening of the crystal grains (a coarse cast-solidified microstructure) during the solidification can be suppressed, is ensured, and casting into approximately a final shape with a high size accuracy (including liquid metal forging) is possible, an article of the cast metal by this casting step may also be used as the two-phase alloy product according to the invention. On the other hand, in the case when it is difficult to suppress the coarse cast-solidified microstructure (for example, in the case when a large sized product is intended to be finally produced), an ingot 20 is once prepared.

In the case when the ingot 20 is prepared, a hot forging step (Step 3: S3), in which the ingot 20 is then subjected to hot forging to thereby mold the ingot 20 into a final shape, is conducted. The method for hot forging is not specifically limited, and a conventional method can be utilized, and the temperature for the hot forging is preferably within the range from 1,050 to 1,250° C. By subjecting to the hot forging, casting defects in the ingot can be eliminated and the coarse cast-solidified microstructure can be broken, and thus a shaped body 30 of the two-phase alloy having a forged microstructure can be obtained.

After the hot forging step S3, where necessary, a solution heat treatment step (Step 4: S4) for subjecting the shaped body 30 (forged body) to a solution treatment can be conducted. The temperature of the solution heat treatment is desirably within the range from 1,050 to 1,150° C., more desirably around 1,100° C. By subjecting the shaped body to the solution treatment, the chemical compositions can be homogenized in the respective phases of the austenite phase and the ferrite phase.

In addition, it is preferable to conduct an aging heat treatment step (Step 5: S5) after the solution heat treatment step S4. The temperature of the aging heat treatment is desirably within the range from 800 to 1,000° C., more desirably around 900° C. Holding duration of the aging heat treatment may be suitably adjusted within the range from 0.5 to 6 hours. By subjecting to the aging heat treatment, the phase ratio of the two phase can be adjusted (the ferrite ratio can be adjusted).

For example, in the case when the ferrite phase is excess over the ferrite ratio that is expected from the incorporated composition, a part of the ferrite phase can undergo phase-transition to an austenite phase by subjecting the shaped body to this aging heat treatment, whereby the ductility and toughness of the product can be adjusted. Conversely, in the case when the ferrite phase is excessively smaller than the ferrite ratio that is expected from the incorporated composition (the austenite phase is in excess), a part of the austenite phase can undergo phase-transition to a ferrite phase, whereby the mechanical strength of the product can be adjusted.

Furthermore, in the case when the two-phase alloy material contains the optional accessory components, by subjecting the shaped body to this aging heat treatment, the above-mentioned phase ratio can be adjusted, and the formation of the compound of the optional accessory components with the impurity components (C, N and O) can be promoted, and thus the impurity components can further be collected and stabilized. As a result, the toughness of the product can further be improved (decrease in the toughness can further be suppressed).

Since the product produced as above is formed of a two-phase alloy including Cr, which is more inexpensive than Ni, as a major component, the cost can be lowered than the cost of a product formed of an Ni based alloy, while having high corrosion resistance and good mechanical properties that are equivalent or more than those of conventional products. Accordingly, the two-phase alloy product of the invention can be preferably utilized as members for apparatus for use in oil wells (for example, members of rotary machines (shafts, bearings and the like of compression machines, pumps and the like)), members for sea water environmental apparatus (for example, members for sea water purification plant devices, umbilical cables) and members for chemical plant apparatus (for example, members for vaporization devices of liquefied natural gas), which are used under strict corrosion circumstances.

Other Exemplary Embodiments of Two-Phase Alloy Product and Production Method Therefor Next, other exemplary embodiments of a two-phase alloy product of the invention and a production method therefor will be described. FIG. 3 is another exemplary operation flowchart showing a method for producing the two-phase alloy product according to the invention. The production method of FIG. 3 is an exemplary method for producing a composite including a substrate and a coating layer of the two-phase alloy formed on the substrate, and shows a lamination formation using an alloy powder.

As shown in FIG. 3, first, a step of mixing and melting raw materials (Step 1: S1), in which raw materials of the two-phase alloy are mixed and melted so as to give a desired chemical composition (major components+accessory components+optional accessory components as necessary) to form a molten metal 10, is conducted. The methods for mixing and melting the raw materials are not specifically limited, and a conventional method in the production of a high corrosion resistance and high mechanical strength alloy can be utilized. For example, as the melting method, a vacuum melting method can be preferably utilized. Furthermore, it is preferable to refine a molten metal 10 by using a vacuum carbon deoxidation method and the like in combination.

Subsequently, an atomizing step in which an alloy powder 40 is formed from the molten metal 10 is conducted (Step 6: S6). The atomizing method is not specifically limited, and a conventional method can be utilized. For example, a gas atomizing method, by which highly clean and homogeneous composition and spherical particles can be obtained, can be preferably used. The average particle size of the alloy powder 40 is preferably 1 µm or more and 100 µm or less in view of handling property and filling property.

Meanwhile, the obtained alloy powder 40 may become the two-phase alloy product of the invention in its original state. For example, the alloy powder 40 can be preferably used as a welding material, a material for powder metallurgy, and a material for laminating shaping.

Subsequently, using the alloy powder 40 prepared above, a laminating shaping step (Step 7: S7), in which a coating layer 52 of the two-phase alloy is formed on a predetermined substrate 51, is conducted. The method for the laminating shaping is not specifically limited, and a conventional method can be utilized. For example, a method for forming a metal powder lamination using electron beam irradiation heating or laser irradiation heating can be preferably utilized.

More specifically, the laminating shaping step includes an alloy powder deposition sub-step, in which a deposit layer of the alloy powder 40 is formed on the substrate 51, and another sub-step of locally melting and solidifying to form a solidified layer, in which: the deposit layer is locally heated to form a fine molten pool of the alloy; and the fine molten pool sequentially solidifies while the local heating is scanned along the surface of the deposit layer, to thereby form a solidified layer of the two-phase alloy. By repeating these two sub-steps (the alloy powder deposition sub-step, the step of local melting and solidifying to form the solidified layer), a composite 50 on which a two-phase alloy coating layer 52 having desired shape and thickness can be prepared.

Although not illustrated in FIG. 3, where necessary, a solution heat treatment step S4 as in FIG. 2 may be conducted after the laminating shaping step S7. By subjecting to the solution treatment, the chemical compositions can be homogenized in the respective phases of the austenite phase and the ferrite phase. Furthermore, in conducting the solution heat treatment step S4, a hot isostatic pressing (HIP) method may be adopted. By conducting the hot isostatic pressing, the solidified microstructure of the two-phase alloy coating layer 52 can further be made denser, and/or the defects in the solidified microstructure can be eliminated.

In addition, where necessary, an aging heat treatment step S5 as in FIG. 2 may be conducted after the solution heat treatment step S4. By subjecting to the aging heat treatment, the phase ratio of the two-phase can be adjusted.

Figure 4A:
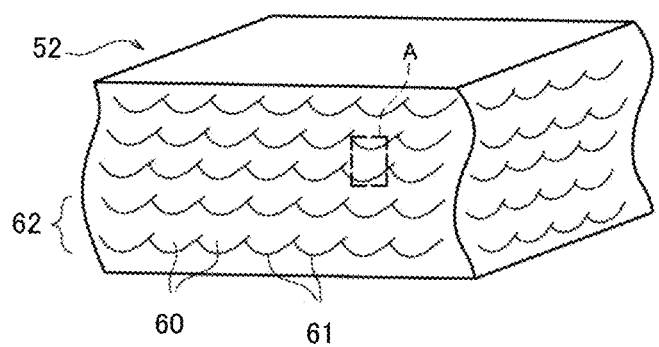
FIG. 4A is a schematic diagram showing a perspective cross-sectional view of an example of the two-phase alloy coating layer obtained by the invention.

Next, the metal microstructure of the above-mentioned two-phase alloy coating layer will be described. FIG. 4A is a schematic diagram showing a perspective cross-sectional schematic view of an example of the two-phase alloy coating layer obtained by the invention, and FIG. 4B is a schematic diagram showing an enlarged view of the part A in FIG. 4A.

As shown in FIG. 4A, the two-phase alloy coating layer 52 of this exemplary embodiment has a metal microstructure formed of an assembly of quench-solidified microstructures 60 that are formed by rapid solidification of the fine molten pool due to the laminating shaping method. Specifically, each quench-solidified microstructure 60 has an approximately hemispherical profile derived from the outer edge shape (melting boundary 61) of the fine molten pool by the local heating. Furthermore, the quench-solidified microstructures 60 are arranged in a two-dimensional shape with directing the circular arcs thereof to the same direction, and thus a layer-like solidified layer 62 is formed. Moreover, a plural number of such solidified layers 62 are laminated in the thickness direction. As a result, the quench-solidified microstructures 60 become a three-dimensionally arranged metal microstructure. Meanwhile, there is also a case when the melting boundary 61 is not clearly observed depending on the condition of the laminating shaping method.

Figure 4B:
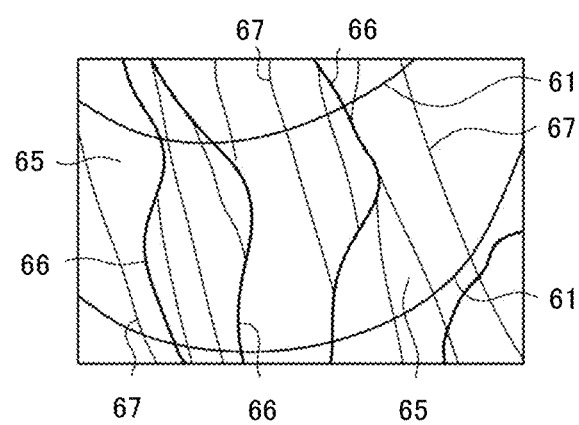
FIG. 4B is a schematic diagram showing an enlarged view of the part A in FIG. 4A.

When the quench-solidified microstructure 60 by the laminating shaping method is observed in detail, as shown in FIG. 4B, columnar crystals 65 extending with striding over melting boundaries 61 have grown in the lamination direction of the solidified layer 62 (the thickness direction of the two-phase alloy coating layer 52), and the columnar crystals 65 are forested through large tilt angle grain boundaries 66. Furthermore, small tilt angle particle boundaries 67 are sometimes observed inside of the columnar crystal 65. In the present invention, a grain boundary where a tilt angle between adjacent crystal grains (a tilt angle of predetermined crystal orientations) is 15° or more is defined as a large tilt angle grain boundary, and a grain boundary where the tilt angle is lower than 15° is defined as a small tilt angle grain boundary. The tilt angle of the crystal grain boundary can be measured by an electron backscatter pattern (EBSP) analysis.

For referring to as a quench-solidified microstructure 60, it is necessary that the columnar crystals 65 have an average crystal grain size of at least 100 µm or less. In view of the mechanical strength and corrosion resistance of the two-phase alloy material, the average crystal grain size of the columnar crystal 65 is more preferably 50 µm or less, further preferably 10 µm or less. Meanwhile, the average crystal grain size in the invention is defined as an average value obtained by reading an optical microscopy image or an electron microscopy image to an image analysis software (e.g., NIH Image, public domain software), by binarizing the read image and by calculating the average value from the binarized short diameter and long diameter of the crystal grain.

Furthermore, in the metal microstructure having the quench-solidified microstructures 60 as in FIGS. 4A and 4B, when a ratio of an average Cr concentration of the austenite phase (γ phase) to an average Cr concentration of the ferrite phase (α phase) "(Cr concentration of γ phase)/(Cr concentration of α phase)" (referred to as a solid-liquid distribution coefficient) was investigated by using an electron probe micro analyzer (EPMA), the ratio (solid-liquid distribution coefficient) was 1.3 or less. Furthermore, it was confirmed that the two-phase alloy material having such composition distribution exhibits higher corrosion resistance than a two-phase alloy material having a composition distribution in which the ratio (solid-liquid distribution coefficient) shows more than 1.3. The details will be described later.

The two-phase alloy coating layer 52 formed by this exemplary embodiment shows high corrosion resistance, and thus can be preferably utilized as a corrosion resistance coating. In other words, the product of this exemplary embodiment (the composite 50 including the substrate 51 and the two-phase alloy coating layer 52 formed thereon) can be preferably utilized as members for apparatus for use in oil wells (for example, compression machines, pumps and the like), members for sea water environmental apparatus (for example, members for sea water purification plant devices, umbilical cables) and members for chemical plant apparatus (for example, members for vaporization devices of liquefied natural gas), which are used under strict corrosion circumstances.

Although a composite including a substrate and a two-phase alloy coating layer formed thereon is described above, this exemplary embodiment is not limited to that composite, and thus a shaped body having a desired shape may be formed by utilizing a laminating shaping method without forming a composite with a substrate. Furthermore, the shaped body may be utilized as a member for a device under a corrosion circumstance.

Figure 5:
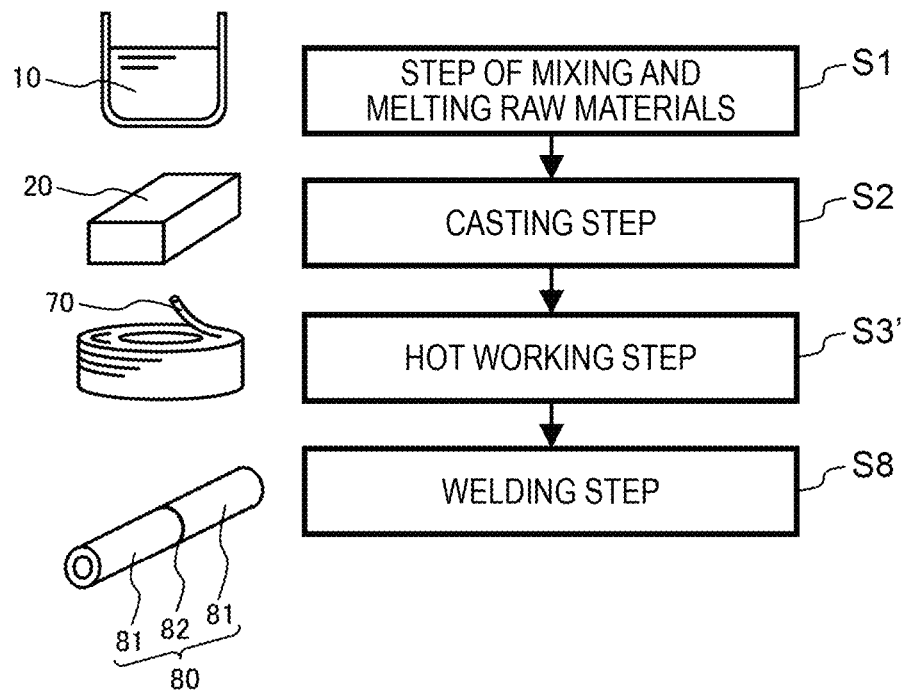
FIG. 5 is still another exemplary operation flowchart showing a method for producing the two-phase alloy product according to the invention.

Still Other Exemplary Embodiments of Two-Phase Alloy Product and Production Method Therefor Next, still other exemplary embodiments of a two-phase alloy product and a production method therefor of the invention will be described. FIG. 5 is still another exemplary operation flowchart showing a method for producing the two-phase alloy product according to the invention. The production method of FIG. 5 shows a procedure in that a rod or a wire formed of the two-phase alloy of the invention is prepared, and that alloy members are welded by using the rod or the wire as a welding material.

As shown in FIG. 5, a step of mixing and melting raw materials S1 as in FIG. 2 is firstly conducted. The methods for mixing and melting the raw materials are not specifically limited, and a conventional method in the production of a high corrosion resistance and high mechanical strength alloy can be utilized. For example, a vacuum melting method can be preferably utilized as the melting method. Furthermore, it is preferable to refine a molten metal 10 by using a vacuum carbon deoxidation method and the like in combination.

Subsequently, an ingot 20 is prepared by conducting a casting step S2 as in FIG. 2.

Next, a hot working step (Step 3': S3'), in which the ingot 20 is subjected to hot working to thereby form a rod or wire 70, is conducted. The method for the hot working for forming the rod or wire 70 is not specifically limited, and a conventional method (for example, extrusion processing, drawing processing) can be utilized, and a temperature for the hot working is preferably within the range from 1,050 to 1,250° C. By subjecting the ingot 20 to the hot working, casting defects in the ingot 20 can be eliminated and coarse cast-solidified microstructure can be broken, and thus a shaped body of the two-phase alloy having a dense and minute metal microstructure can be obtained.

The obtained alloy rod or alloy wire 70 may be the two-phase alloy product of the invention in its original state. For example, the alloy rod or alloy wire 70 can be preferably used as a welding material.

Next, a welding step (Step 8: S8), in which predetermined alloy members 81 are welded to form a welded joint 80 using the alloy rod or alloy wire 70 prepared above, is conducted. The welding method is not specifically limited, and a conventional method can be utilized. For example, laser welding, electron beam welding or arc welding can be preferably utilized.

Furthermore, the material of the alloy members 81 as materials to be welded is not specifically limited, but in the case when the welded product (the welded joint 80) is used as a member for apparatus under a corrosion circumstance, it is preferable that a two-phase alloy material is used as the materials to be welded, and it is more preferable that the two-phase alloy of the invention is used as the two-phase alloy material.

Although not illustrated in FIG. 5, a solution heat treatment step S4 as in FIG. 2 may be conducted as necessary after the welding step S8. By subjecting to the solution treatment, the chemical compositions can be homogenized in the respective phases of the austenite phase and the ferrite phase.

In addition, an aging heat treatment step S5 as in FIG. 2 may be conducted as necessary after the solution heat treatment step S4. By subjecting to the aging heat treatment, the phase ratio of the two phases can be adjusted.

The welded part 82 of the welded joint 80 obtained by this exemplary embodiment has a metal microstructure formed of quench-solidified microstructures 60 that are similar to those in FIG. 4B, since the mechanism of melting solidification is basically similar to that of the above-mentioned laminating shaping. Specifically, the welded part 82 has a fine microstructure formed of columnar crystals 65 having an average crystal grain size of 100 μm or less and having a ratio of an average Cr concentration of the γ phase to an average Cr concentration of the α phase (solid-liquid distribution coefficient) of 1.3 or less.

As mentioned before, since the fine microstructure exhibits high corrosion resistance, the welded joint 80 having high corrosion resistance can be obtained. In other words, the product of this exemplary embodiment (the welded joint 80 welded through the two-phase alloy welded part 82 of the invention) can provide a member having a larger size as a member for apparatus under a corrosion circumstance.

EXAMPLES

The present invention will further be explained more specifically by Examples and Comparative Examples. However, the invention is not limited to these Examples.

Preparation of Examples 1 to 14 and Comparative Examples 1 to 5 of Alloy Products Using Invention Alloys 1 to 8 (IA 1 to IA 8) and Comparative Alloys 1 to 5 (CA 1 to CA 5) having the chemical compositions shown in Table 1, alloy products (Examples 1 to 14 and Comparative Examples 1 to 5) were prepared. Comparative Alloy CA 5 is a commercially available two-phase stainless steel referred to as a super two-phase steel. The content (unit: % by mass) of each component is converted so that the total mass of the chemical composition described in Table 1 becomes 100% by mass.

TABLE 1

Chemical compositions of Invention Alloys 1 to 8 and Comparative Alloys 1 to 5.

| Alloy No. | | Chemical composition (% by mass) | | | | | | | | | | | |
|---|---|---|---|---|---|---|---|---|---|---|---|---|---|
| | | Cr | Ni | Fe | Ni + Fe | Mn | Si | Cu | P | S | C | N | O |
| Invention Alloys | IA 1 | 59.3 | 18.4 | 20.1 | 38.6 | 1.48 | 0.58 | — | 0.013 | 0.0011 | 0.014 | 0.018 | 0.009 |
| | IA 2 | 53.3 | 24.7 | 19.9 | 44.5 | 1.66 | 0.44 | — | 0.016 | 0.0016 | 0.019 | 0.011 | 0.014 |
| | IA 3 | 45.7 | 31.2 | 21.1 | 52.2 | 1.50 | 0.51 | — | 0.023 | 0.0019 | 0.021 | 0.009 | 0.017 |
| | IA 4 | 40.2 | 38.8 | 19.2 | 58.0 | 1.34 | 0.43 | — | 0.018 | 0.0013 | 0.011 | 0.012 | 0.011 |
| | IA 5 | 60.1 | 24.7 | 13.0 | 37.8 | 1.61 | 0.50 | — | 0.016 | 0.0021 | 0.020 | 0.011 | 0.008 |
| | IA 6 | 44.8 | 41.0 | 12.2 | 53.3 | 1.38 | 0.49 | — | 0.021 | 0.0015 | 0.013 | 0.008 | 0.012 |
| | IA 7 | 50.4 | 20.2 | 27.3 | 47.5 | 1.55 | 0.53 | — | 0.017 | 0.0011 | 0.015 | 0.014 | 0.016 |
| | IA 8 | 35.1 | 31.8 | 31.2 | 63.0 | 1.43 | 0.48 | — | 0.014 | 0.0018 | 0.017 | 0.012 | 0.010 |
| Comparative Alloys | CA 1 | 86.0 | 12.1 | — | 12.1 | 1.44 | 0.44 | — | 0.012 | 0.0012 | 0.015 | 0.011 | 0.010 |
| | CA 2 | 75.8 | 12.1 | 10.1 | 22.2 | 1.46 | 0.48 | — | 0.014 | 0.0013 | 0.018 | 0.015 | 0.008 |
| | CA 3 | 66.5 | 12.0 | 19.6 | 31.6 | 1.39 | 0.46 | — | 0.002 | 0.0016 | 0.019 | 0.011 | 0.012 |
| | CA 4 | 22.0 | 45.2 | 30.8 | 76.0 | 1.45 | 0.50 | — | 0.013 | 0.0015 | 0.017 | 0.014 | 0.011 |
| | CA 5 | 25.0 | 6.9 | 66.2 | 73.1 | 0.84 | 0.50 | 0.19 | 0.002 | 0.0020 | 0.019 | 0.270 | 0.034 |

"—" indicates that the component was not mixed purposely.

As shown in Table 1, Invention Alloys IA 1 to IA 8 and Comparative Alloys CA 1 to CA 3 are Cr based alloys containing Cr as a main component. Among those, CA 1 to CA 3 are high Cr based alloys containing more than 65% by mass of Cr. Comparative Alloy CA 4 is an Ni based alloy containing Ni as a main component. Comparative Alloy CA 5 is a commercially available two-phase stainless steel as mentioned above, and is an Fe based alloy containing Fe as a main component.

Each alloy product (except for Comparative Example 5) was prepared in line with the production method shown in FIG. 1. First, the raw materials of each alloy were mixed, and vacuum melting was conducted to form a molten metal by using a high frequency vacuum melting furnace ($5 \times 10^{-3}$ Pa or less, 1,600° C. or more). Subsequently, the molten metal was casted into a predetermined mold to thereby prepare an ingot of each alloy.

Next, the obtained each ingot was subjected to a hot forging treatment with being careful not to cause forging crack to thereby form into a predetermined shape. The conditions on Examples 1 to 14 and Comparative Example 4 were a forging temperature: 1,050 to 1,250° C., a forging rate: 8 mm/s or less, a reduction amount per one forging: 10 mm or less, and a number of forging in the step: 6 or more times. The hot forging conditions on Comparative Examples 1 to 3 were such that the reduction amount per one forging was decreased and the number of forging in the step was increased, and other conditions were the same, so that the total amount of forging deformation became the same as those of the materials of Invention Alloys.

The range of the forging temperature was determined as follows. A test piece for a tensile test was separately cut out of each ingot and processed, and the test piece was subjected to a high temperature tensile test by using a Gleeble tester (test temperature: 800 to 1,350° C., tensile rate: 10 mm/s). As a result of the high temperature tensile test, the temperature range at which reduction of area of the test piece became 60% or more was deemed as a forging temperature range.

Each alloy sample that had undergone hot forging was subjected to a solution heat treatment (held at 1,100° C. for 60 minutes, then cooled with water). Some of the samples were used in this state as alloy products for tests and evaluations (Examples 1, 3, 5, 9 and 11 to 14, and Comparative Examples 1 to 4). Furthermore, the purchased CA 5 sample was subjected to a similar solution heat treatment and used as an alloy product for tests and evaluations (Comparative Example 5).

Other some samples that had undergone a solution heat treatment were subjected to an aging heat treatment (held at 800 to 1,000° C. for 60 minutes, and then cooled with water). The samples that had undergone the aging heat treatment were used as alloy products for tests and evaluations (Examples 2, 4, 6 to 8 and 10).

The relationships between the alloy numbers and the heat treatment conditions in the alloy products of Examples 1 to 14 and Comparative Examples 1 to 5 are shown in Table 2 mentioned later.

Tests and Evaluations on Alloy Products of Examples 1 to 14 and Comparative Examples 1 to 5

(1) Observation of Microstructure

A test piece for microstructure observation was cut out from each alloy product, the surface of the test piece was subjected to mirror polishing, and electric field etching was conducted in an aqueous oxalic acid solution. The polished surface was observed with an optical microscope. FIG. 1 as previously shown is an optical microscope photograph of the metal microstructure of Example 5.

As mentioned above, the two-phase alloy material of the invention has a metal microstructure in which an austenite phase P1 exhibiting a bright color and a ferrite phase P2 exhibiting a dark color are dispersed and mixed with each other. Furthermore, since hot forging was conducted, it is confirmed that the alloy material has a microstructure such that the cast-solidified microstructure (for example, a dendrite that is inherent to the cast solidified microstructure) has been broken and that equi-axed crystal grains are at least partially seen (so-called a forged microstructure). The microstructures are similar in other Examples.

(2) Measurement of Ferrite Ratio

An electron backscatter pattern (EBSP) analysis was conducted on the polished surface of the test piece for microstructure observation to thereby measure the occupation ratio of the ferrite phase (ferrite ratio, unit: %). For this measurement, there was used an apparatus in which a crystal orientation measurement apparatus manufactured by TSL Solutions was attached to a scanning electron microscope (S-4300SE) manufactured by Hitachi High-Technologies Corporation. The results are also shown in Table 2.

(3) Microstructure Stability Test

A test piece for a microstructure stability test was cut out from each of the alloy products of Examples, and a heat treatment by holding at 800° C. for 60 minutes was conducted. An X-ray diffraction measurement was conducted to the surface of each test piece, and the presence or absence of the production of a σ phase of an intermetallic compound was investigated. As a result of the investigation, it is confirmed that any σ phase is not detected in either of Examples 1 to 14 and thus the σ phase is difficult to be generated.

(4) Vickers Hardness Test

As one of the evaluations of mechanical properties, a Vickers hardness test (load: 1 kg, load application time: 15 s) was conducted to the test piece for the previous microstructure observation by using a Vickers hardness meter. The Vickers hardness was obtained as an average value of five times of measurements. The results are also shown in Table 2.

(5) Room Temperature Tensile Test

A test piece for a tensile test (diameter: 4 mm, parallel part length: 20 mm) was cut out and worked from each of the prepared alloy products. As the evaluation of other mechanical properties, a room temperature tensile test was conducted on each test piece by using a tensile tester (strain rate: $3 \times 10^{-4}$ s$^{-1}$), and the 0.2% yield strength, tensile strength and elongation at break were measured. In the case when the test piece was broken before a clear tensile strength was recognized, the stress at break was measured. The results of the tensile test were obtained as average values of the three times of measurements.

As a result of the measurement of the elongation at break, 15% or more is evaluated as Rank A, 5% or more and lower than 15% is evaluated as Rank B, 2% or more and lower than 5% is evaluated as Rank C, and lower than 2% is evaluated as Rank D. Rank C or higher ranks are judged to be acceptable, and Rank D is judged to be unacceptable. The results of the room temperature tensile test are also shown in Table 2.

(6) Pitting Test

As a kind of an evaluation of corrosion resistance, a pitting test was conducted. A polarized test piece for a pitting test was cut out from each of the prepared alloy products. The pitting test was conducted on each polarized test piece in accordance with JIS G0577 (2005). Specifically, a gap corrosion-preventing electrode was attached to the polarized test piece, a saturated calomel electrode was used as a reference electrode, and an anode polarized curve of the polarized test piece was measured to thereby obtain a pitting generating potential corresponding to a current density of 100 μA/cm². The results of the pitting test are also shown in Table 2. Furthermore, after the measurement of the anode polarized curve, the presence or absence of the generation of pitting was investigated by using an optical microscope.

(7) Sulfuric Acid Resistance Test

As another kind of evaluation of the corrosion resistance, a sulfuric acid resistance test was conducted. A polarized test piece for a sulfuric acid resistance test was cut out from each alloy product in a similar manner to that of the pitting test. Specifically, in the sulfuric acid resistance test, a gap corrosion-preventing electrode was attached to a polarized test piece, and there was measured an anode polarized curve of the polarized test piece in an aqueous sulfuric acid solution (pH=2.0, 30° C.) (from a natural immersion potential until reaching a potential of 1,300 mV (vs. SHE) by a kinetic potential method at a sweeping rate of 200 μA/s). A corrosion current density corresponding to a potential 400 mV (vs. SHE) was obtained from the obtained polarized curve.

As a result of the measurement, the corrosion current density corresponding to a potential of 400 mV (vs. SHE) in Comparative Example 5 (a commercially available two-phase stainless steel) is 1.32 μA/cm². The ratio of the corrosion current density of each alloy product is calculated with deeming this corrosion current density as 100%. The results of the sulfuric acid resistance test are also shown in Table 2.

TABLE 2

Conditions for solution and aging heat treatments and results of tests and evaluations of Examples 1 to 14 and Comparative Examples 1 to 5 of alloy products.

|  |  | Alloy No. | Solution heat treatment (°C) | Aging heat treatment (°C) | Ferrite ratio (%) | Vickers hardness (Hv) | 0.2% yield strength (MPa) | Tensile strength (MPa) | Elongation at break | Pitting potential (mV) | Sulfuric acid resistance (%) |
|---|---|---|---|---|---|---|---|---|---|---|---|
| Products of Invention Alloys | Example 1 | IA 1 | 1100 | — | 84 | 564 | 1125 | 1482* | C | 1556 | 8 |
|  | Example 2 |  |  | 900 | 74 | 518 | 1049 | 1365* | C | — | 9 |
|  | Example 3 | IA 2 | 1100 | — | 68 | 483 | 1114 | 1393* | C | 1521 | 11 |
|  | Example 4 |  |  | 900 | 56 | 437 | 1005 | 1279* | B | — | 8 |
|  | Example 5 | IA 3 | 1100 | — | 43 | 442 | 1014 | 1342* | B | 1428 | 5 |
|  | Example 6 |  |  | 800 | 40 | 352 | 902 | 1244* | B | — | 7 |
|  | Example 7 |  |  | 900 | 41 | 360 | 887 | 1220 | A | — | 9 |
|  | Example 8 |  |  | 1000 | 42 | 371 | 910 | 1290* | B | — | 6 |
|  | Example 9 | IA 4 | 1100 | — | 16 | 264 | 581 | 946 | A | 1250 | 18 |
|  | Example 10 |  |  | 900 | 24 | 281 | 612 | 1104 | A | — | 16 |
|  | Example 11 | IA 5 | 1100 | — | 75 | 525 | 1102 | 1287* | C | 1605 | 10 |
|  | Example 12 | IA 6 | 1100 | — | 24 | 269 | 630 | 1173 | A | 1186 | 19 |
|  | Example 13 | IA 7 | 1100 | — | 76 | 531 | 1098 | 1185* | C | 1512 | 5 |
|  | Example 14 | IA 8 | 1100 | — | 26 | 277 | 637 | 1163 | A | 1125 | 16 |
| Products of Comparative Alloys | Comparative Example 1 | CA 1 | 1100 | — | 100 | 850 | Unmeasurable | 1249* | D | — | 8 |
|  | Comparative Example 2 | CA 2 | 1100 | — | 100 | 720 | Unmeasurable | 1318* | D | — | 10 |
|  | Comparative Example 3 | CA 3 | 1100 | — | 100 | 700 | Unmeasurable | 1372* | D | — | 7 |

TABLE 2-continued

Conditions for solution and aging heat treatments and results of tests and evaluations of Examples 1 to 14 and Comparative Examples 1 to 5 of alloy products.

|  | Alloy No. | Solution heat treatment (°C) | Aging heat treatment (°C) | Ferrite ratio (%) | Vickers hardness (Hv) | 0.2% yield strength (MPa) | Tensile strength (MPa) | Elongation at break | Pitting potential (mV) | Sulfuric acid resistance (%) |
|---|---|---|---|---|---|---|---|---|---|---|
| Comparative Example 4 | CA 4 | 1100 | — | 0 | 180 | 250 | 512 | A | — | — |
| Comparative Example 5 | CA5 | 1100 | — | 45 | — | — | — | — | — | 100 |

"*" indicates elongation at break.
"—" indicates that the test was not conducted.

As shown in Tables 1 and 2, in Comparative Examples 1 to 3 (products formed of CA 1 to CA 1), the content (s) of one or more of the major components (Cr, Ni, Fe) is/are out of the definition of the invention, and show a metal microstructure of a single phase of a ferrite phase (ferrite ratio: 100%). As a result, Comparative Examples 1 to 3 exhibit good corrosion resistance but little ductility (i.e. brittle), thus there are disadvantages in the mechanical properties.

Comparative Example 4 (a product formed of CA 4) is an Ni based alloy material as mentioned above, and shows a metal microstructure of a single phase of an austenite phase (ferrite ratio: 0%). There are weak points in the mechanical strength (Vickers hardness, 0.2% yield strength and tensile strength). Furthermore, since the content of the Ni component is high, there is also an disadvantage from the viewpoint of material cost.

Comparative Example 5 formed of a commercially available two-phase stainless steel (CA 5) has a ferrite ratio of 45%.

In contrast to these Comparative Examples, either of Examples 1 to 14 (the products formed of IA 1 to IA 8) has a metal microstructure of a two-phase alloy in which an austenite phase and a ferrite phase are present in a mixed state. Furthermore, in the Examples undergone an aging heat treatment, the ferrite ratio changes comparing with that of Examples not undergone the aging heat treatment. That is, it is confirmed that the aging heat treatment after the solution heat treatment acts as a heat treatment for adjusting a ferrite ratio.

Regarding the mechanical properties, it is confirmed that either of Examples 1 to 14 shows good properties (for example, a Vickers hardness of more than 250 Hv, a 0.2% yield strength of more than 550 MPa, a tensile strength of more than 900 MPa, and an elongation at break of 2% or more).

Regarding the corrosion resistance, in all of the samples in which the pitting test was conducted (Examples 1, 3, 5, 9 and 11 to 14), the pitting generation potential corresponding to a current density of 100 μA/cm$^2$ is 1.1 V or more, and in the range more than the pitting generation potential, oxygen was generated in the transpassive region. In all of those samples, generation of pitting was not observed. Furthermore, in the sulfuric acid resistance test, Examples 1 to 14 show corrosion current densities of 5 to 20% as compared to that of Comparative Example 5. That is, it is confirmed that Examples 1 to 14 have excellent corrosion resistance.

It is confirmed from these test results that Examples 1 to 14 have good mechanical properties and excellent corrosion resistance that are equivalent or more than those of a conventional material. Furthermore, since the content of the Cr component is high, it can be said that the cost can be decreased than that of a conventional Ni based alloy material.

Preparation of Examples 15 to 32 of Alloy Products

Using Invention Alloys 9 to 17 (IA 9 to IA 17) having the chemical compositions shown in Table 3, alloy products (Examples 15 to 32) were prepared. The content (unit: % by mass) of each component is converted so that the total mass of the chemical composition described in Table 3 becomes 100% by mass.

TABLE 3

Chemical compositions of Invention Alloys 9 to 17.

| Alloy No. | | Cr | Ni | Fe | Ni +Fe | Mn | Si | P | S | C | N | O | V | Nb | Ta | Ti |
|---|---|---|---|---|---|---|---|---|---|---|---|---|---|---|---|---|
| Invention Alloys | IA 9 | 58.9 | 19.7 | 19.0 | 38.7 | 1.52 | 0.45 | 0.018 | 0.0013 | 0.012 | 0.013 | 0.016 | — | 0.33 (1.2) | — | — |
| | IA 10 | 53.0 | 24.7 | 19.9 | 45.5 | 1.68 | 0.36 | 0.026 | 0.0014 | 0.015 | 0.008 | 0.017 | — | 0.40 (1.5) | — | — |
| | IA 11 | 46.6 | 31.2 | 19.8 | 51.0 | 1.44 | 0.56 | 0.021 | 0.0021 | 0.011 | 0.010 | 0.019 | — | 0.21 (0.78) | — | 0.06 (0.52) |
| | IA 12 | 38.0 | 39.6 | 20.4 | 60.0 | 1.29 | 0.48 | 0.015 | 0.0018 | 0.028 | 0.007 | 0.012 | — | — | — | 0.16 (0.9) |
| | IA 13 | 64.1 | 20.5 | 12.8 | 33.4 | 1.77 | 0.29 | 0.022 | 0.0012 | 0.014 | 0.011 | 0.009 | — | — | 0.48 (0.11) | — |
| | IA 14 | 45.1 | 41.0 | 12.1 | 53.1 | 1.14 | 0.42 | 0.018 | 0.0017 | 0.009 | 0.009 | 0.016 | — | — | — | 0.22 (1.4) |
| | IA 15 | 52.7 | 19.9 | 25.4 | 45.2 | 1.38 | 0.50 | 0.020 | 0.0019 | 0.011 | 0.011 | 0.018 | 0.13 (0.84) | — | — | — |

TABLE 3-continued

Chemical compositions of Invention Alloys 9 to 17.

| Alloy No. | | Cr | Ni | Fe | Ni +Fe | Mn | Si | P | S | C | N | O | V | Nb | Ta | Ti |
|---|---|---|---|---|---|---|---|---|---|---|---|---|---|---|---|---|
| | IA 16 | 41.8 | 26.1 | 29.7 | 55.8 | 1.66 | 0.46 | 0.016 | 0.0011 | 0.007 | 0.007 | 0.014 | 0.08 (0.56) | 0.19 (0.76) | — | — |
| | IA 17 | 34.8 | 33.3 | 30.0 | 63.3 | 1.32 | 0.31 | 0.022 | 0.0018 | 0.009 | 0.009 | 0.011 | — | — | — | 0.24 (1.6) |

Numerical values in ( ) in V, Nb, Ta and Ti mean the ratios to the total content of C, N and O.
"—" indicates that the component was not mixed purposely.

As shown in Table 3, Invention Alloys IA 9 to IA 17 further contain at least one kind of optional accessory component(s) (V, Nb, Ta and Ti) in addition to the major components (Cr, Ni and Fe) and accessory components (Mn and Si). The total content of the optional accessory component(s) is within the range of 0.8 times or more and 2 times or less of the total content of C, N and O.

Each alloy product was prepared according to the production method shown in FIG. 1, and an aging heat treatment step (held at 800 to 1,050° C. for 60 minutes, and then cooled with water) was conducted after a solution heat treatment step (held at 1,100° C. for 60 minutes, and then cooled with water). The relationships between the alloy numbers and the heat treatment conditions in the alloy products of Examples 15 to 32 are shown in Table 4 mentioned later.

Tests and Evaluations on Alloy Products of Examples 15 to 32

Examples 15 to 32 prepared were subjected to microstructure observation, ferrite ratio measurement, a microstructure stability test, a Vickers hardness test, a room temperature tensile test, a pitting test and a sulfuric acid resistance test in similar manners to those mentioned above. The results of the respective tests and evaluations are shown in Table 4.

As shown in Tables 3 and 4, either of Examples 15 to 32 (products formed of IA 9 to IA 17) has a metal microstructure of a two-phase alloy containing an austenite phase and a ferrite phase in a mixed state as in FIG. 1. Furthermore, the ferrite ratio changes according to the temperatures in the aging heat treatment. That is, it is confirmed that the aging heat treatment after the solution heat treatment acts as a heat treatment for adjusting the ferrite ratio.

Regarding the microstructure stability (property to suppress the generation of a σ phase), as a result of the investigation (the heat treatment by holding at 800° C. for 60 minutes, and the X-ray diffraction measurement), it is confirmed that any σ phase was not detected and thus a σ phase is difficult to be formed in either of Examples 15 to 32.

Regarding the corrosion resistance, in all of the samples in which the pitting test was conducted (Examples 16, 18, 20, 22, 23, 25, 27 and 32), the pitting generation potential corresponding to a current density of 100 μA/cm$^2$ is 1.1 V or more, and in the range more than the pitting generation potential, oxygen was generated in the transpassive region. In all of those samples, generation of pitting was not observed. Furthermore, in the sulfuric acid resistance test, Examples 15 to 32 show corrosion current densities of 1 to 10% as compared to that of Comparative Example 5. That is, it is confirmed that Examples 15 to 32 have extremely excellent corrosion resistance.

TABLE 4

Conditions for solution and aging heat treatments and results of tests and evaluations of Examples 15 to 32 of alloy products.

| | | Alloy No. | Solution heat treatment (°C) | Aging heat treatment (°C) | Ferrite ratio (%) | Vickers hardness (Hv) | 0.2% yield strength (MPa) | Tensile strength (MPa) | Elongation at break | Pitting resistance (mV) | Sulfuric acid potential (%) |
|---|---|---|---|---|---|---|---|---|---|---|---|
| Products of Invention Alloys | Example 15 | IA 9 | 1100 | 900 | 74 | 522 | 1120 | 1362* | B | — | 1.2 |
| | Example 16 | | | 1000 | 86 | 541 | 1154 | 1426* | B | 1560 | — |
| | Example 17 | IA 10 | 1100 | 900 | 54 | 431 | 989 | 1288* | B | — | 0.8 |
| | Example 18 | | | 1050 | 70 | 453 | 1075 | 1378* | B | 1518 | — |
| | Example 19 | IA 11 | 1100 | 900 | 42 | 355 | 911 | 1166 | A | — | 0.9 |
| | Example 20 | | | 1000 | 46 | 417 | 978 | 1344* | B | 1452 | — |
| | Example 21 | IA 12 | 1100 | 900 | 22 | 249 | 614 | 979 | A | — | 1.1 |
| | Example 22 | | | 950 | 16 | 216 | 622 | 925 | A | 1283 | — |
| | Example 23 | IA 13 | 1100 | 1000 | 85 | 471 | 1114 | 1462* | B | 1620 | 1.4 |
| | Example 24 | IA 14 | 1100 | 900 | 28 | 301 | 675 | 984 | A | — | 2.7 |
| | Example 25 | | | 1000 | 20 | 268 | 618 | 1075 | A | 1167 | — |
| | Example 26 | IA 15 | 1100 | 900 | 66 | 482 | 1078 | 1366* | B | — | 0.8 |
| | Example 27 | | | 1000 | 66 | 325 | 849 | 1166* | B | 1556 | — |
| | Example 28 | IA 16 | 1100 | 800 | 40 | 361 | 869 | 1150 | A | — | 9.1 |
| | Example 29 | | | 900 | 40 | 356 | 857 | 1185 | A | — | 5.7 |
| | Example 30 | | | 1000 | 42 | 372 | 871 | 1161 | A | — | 5.7 |
| | Example 31 | IA 17 | 1100 | 900 | 21 | 240 | 602 | 883 | A | — | 10.2 |
| | Example 32 | | | 1000 | 13 | 208 | 568 | 833 | A | 1126 | — |

"*" indicates elongation at break.
"—" indicates that the test was not conducted.

Regarding the mechanical properties, it is confirmed that either of Examples 15 to 32 shows good properties (for example, a Vickers hardness of more than 200 Hv, a 0.2% yield strength of more than 550 MPa, a tensile strength of more than 800 MPa, and an elongation at break of 5% or more). In Examples 15 to 32, the elongation at break is significantly improved. The reason therefor is considered that the impurities C, N and O were assembled and stabilized by adding the optional accessory components within suitable ranges.

Figure 6:
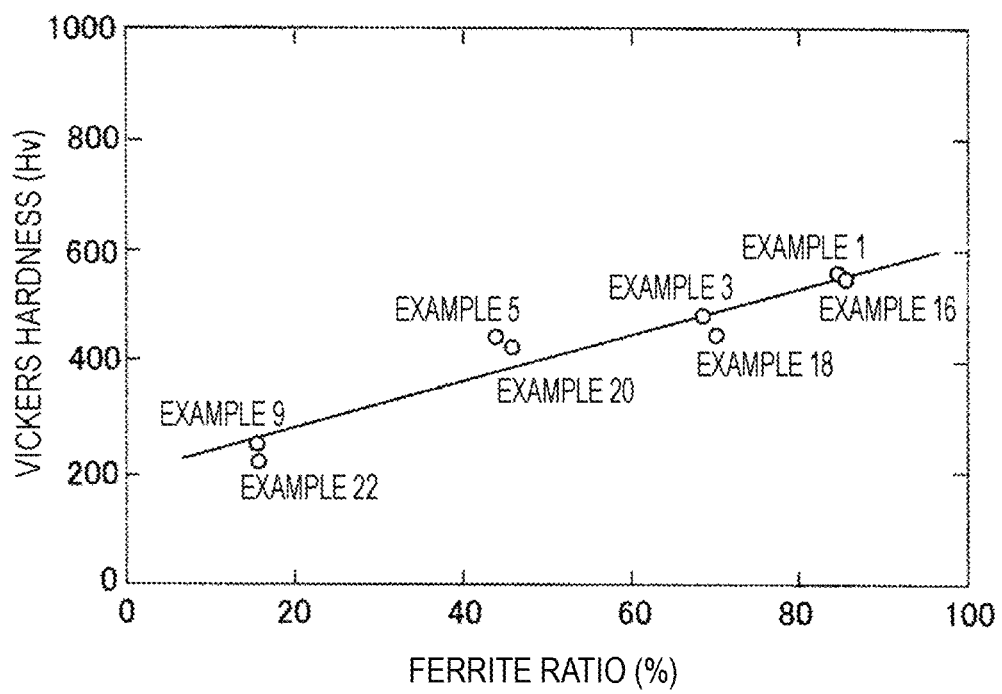
FIG. 6 is a graph showing a relationship between a ferrite ratio and a Vickers hardness in the two-phase alloy product of the invention.
Figure 7:
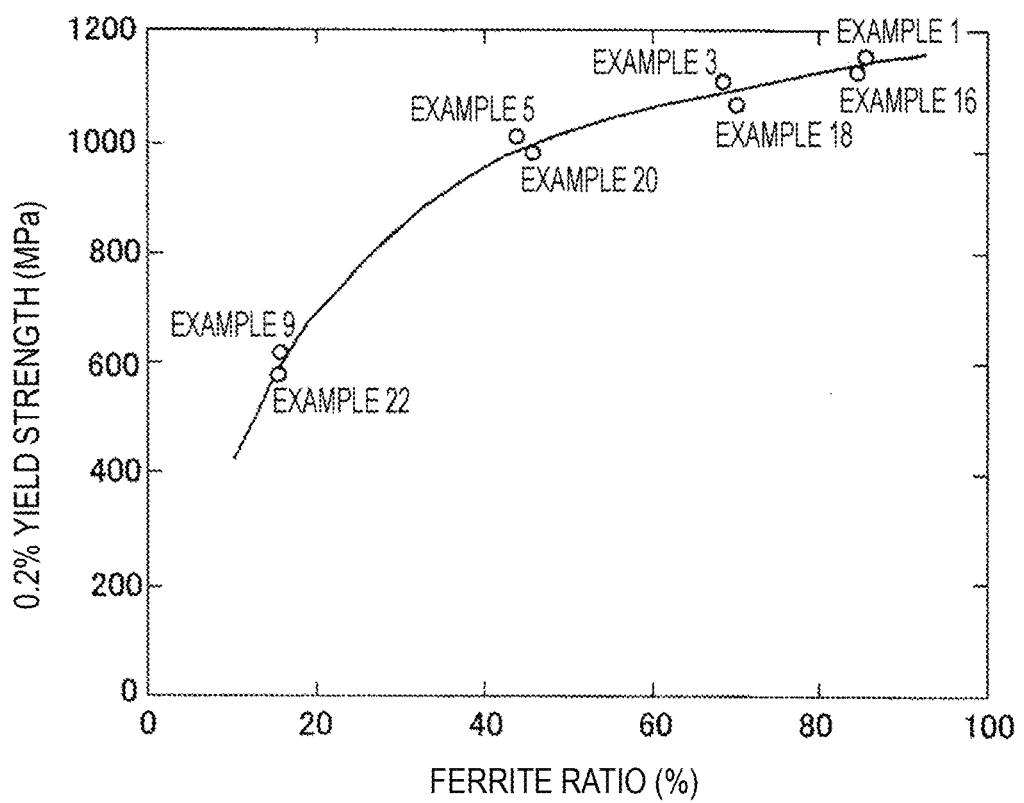
FIG. 7 is a graph showing a relationship between a ferrite ratio and a 0.2% yield strength in the two-phase alloy product of the invention.

Next, a relationship among the ferrite ratio, Vickers hardness and 0.2% yield strength was investigated. FIG. 6 is a graph showing a relationship between the ferrite ratio and the Vickers hardness in the two-phase alloy product of the invention, and FIG. 7 is a graph showing a relationship between the ferrite ratio and the 0.2% yield strength in the two-phase alloy product of the invention. The comparison is made among Examples 1, 3, 5, 9, 16, 18, 20 and 22 as the two-phase alloy products in which the Fe content is around 20% by mass.

As shown in FIG. 6, it is found that the Vickers hardness simply increases in accordance with the increase in the ferrite ratio, and becomes approximately 400 Hv or more as the ferrite ratio becomes greater than 40%. Furthermore, as shown in FIG. 7, it is also found that the 0.2% yield strength increases in a simple manner in accordance with the increase in the ferrite ratio, and becomes approximately 1,000 MPa or more when the ferrite ratio becomes greater than 40%.

In the Examples shown in FIGS. 6 and 7, as mentioned above, the Fe content is around 20% by mass, and the ferrite ratio increases with increasing the Cr content. In other words, it can be said that the ferrite ratio tends to increase when the Cr content is increased, and the Vickers hardness and the 0.2% yield strength tend to increase, in the two-phase alloy of the invention.

However, as shown in Table 2, when the ferrite phase becomes a single phase as in Comparative Examples 1 to 3, it is not preferable since the alloy product has little ductility and becomes brittle. In other words, it is important to control the ferrite ratio to be 90% or less to thereby retain the mixed state of the two phases. Furthermore, the elongation at break can be significantly improved by adding optional accessory components (V, Nb, Ta and Ti). Whether the mechanical strength takes priority or the ductility takes priority may be suitably selected depending on the property required for the two-phase alloy product.

Examples 33 to 36 of Alloy Products

Using Invention Alloys 1 to 4 shown in Table 1 (IA 1 to IA 4), alloy powders (average particle size: 100 μm or less) were prepared in accordance with the production method shown in FIG. 3, and alloy products (Examples 33 to 36) were then prepared by a metal powder laminating shaping method. In this experiment, shaped bodies that were not combined with a substrate were formed.

Tests and Evaluations on Alloy Products of Examples 33 to 36

Figure 8A:
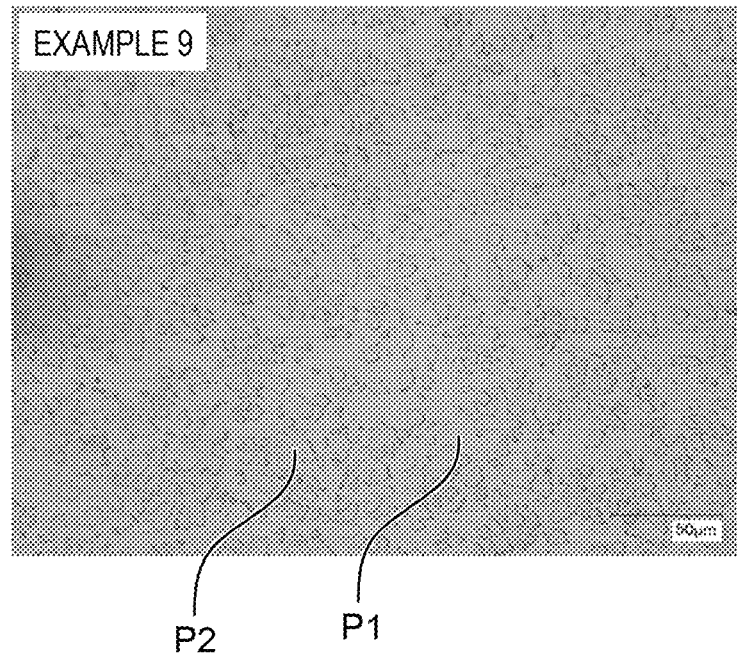
FIG. 8A is an optical microscope photograph showing a metal microstructure of Example 9.
Figure 8B:
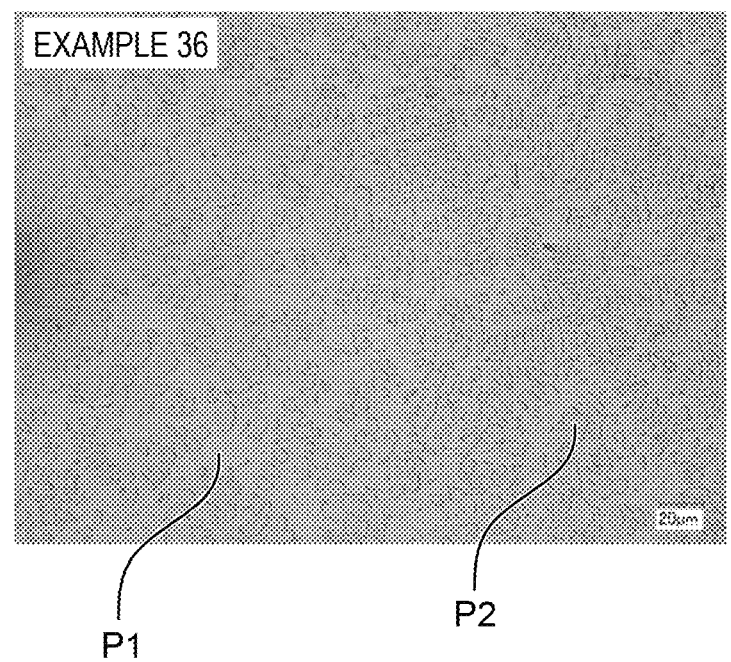
FIG. 8B is an optical microscope photograph showing a metal microstructure of Example 36.

Examples 33 to 36 as prepared were subjected to microstructure observation, ferrite ratio measurement, a microstructure stability test, a Vickers hardness test, a room temperature tensile test and a pitting test in similar manners to those mentioned above, and compared with Examples 1, 3, 5 and 9. The methods for the production and the results of the tests and evaluations of the Examples are shown in Table 5 mentioned below. Furthermore, the results of the microstructure observation are shown in FIGS. 8A and 8B mentioned below.

In addition to the above-mentioned tests, a ratio of the average Cr concentration of the austenite phase (γ phase) to the average Cr concentration of the ferrite phase (α phase) "(Cr concentration of γ phase)/(Cr concentration of α phase)" (referred to as a solid-liquid distribution coefficient) was investigated by using an electron probe micro analyzer (SPMA) on Examples 36 and 9. The results are also shown in Table 5.

Figure 9:
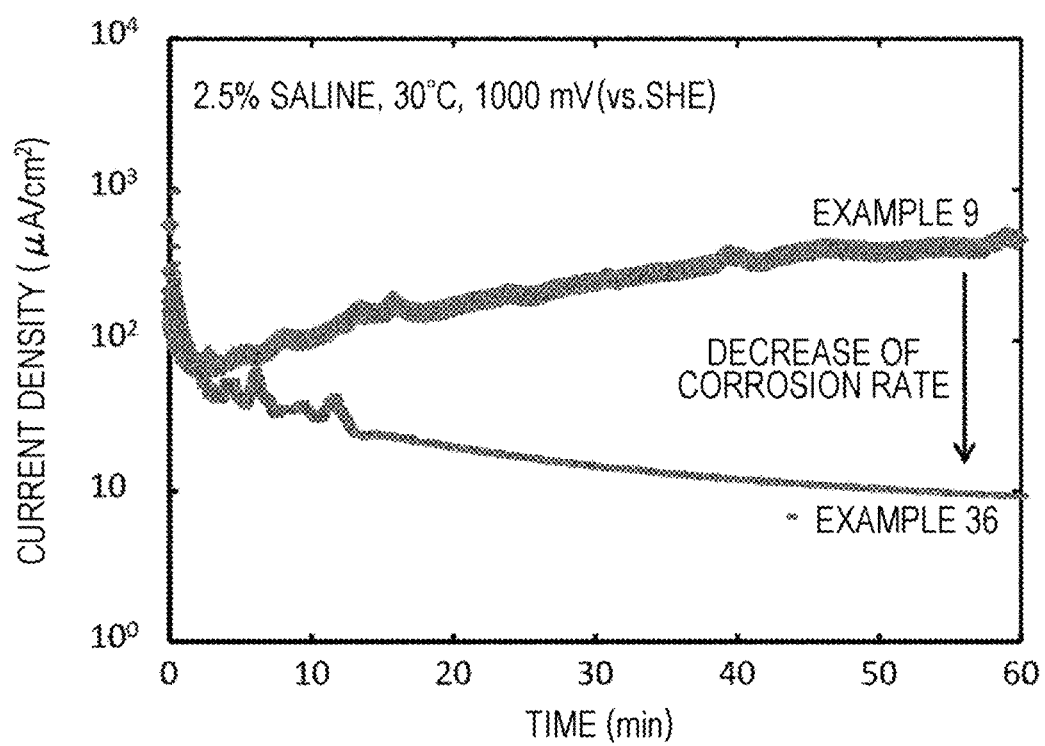
FIG. 9 is a chart showing change with time of a current density under potentiostatic polarization at 1,000 mV (vs. SHE) in Examples 9 and 36.

Furthermore, change with time in the corrosion current density in potentiostatic polarization at 1,000 mV (vs. SHE) was measured under the corrosion test circumstance (3.5% saline, 30° C.) of JIS G0577 (2005) in Examples 36 and 9. The results are shown in FIG. 9 mentioned below.

TABLE 5

Preparation methods and results of tests and evaluations of Examples 33 to 36 and Examples 1, 3, 5 and 9 of alloy products.

| Products of Invention Alloys | Alloy No. | Production method | Ferrite ratio (%) | Vickers hardness (Hv) | 0.2% yield strength (MPa) | Tensile strength (MPa) | Elonation at break | Pitting potential (mV) | Solid liquid distribution coefficient |
|---|---|---|---|---|---|---|---|---|---|
| Example 33 | IA 1 | Mixing/melting ↓ | 80 | 677 | 1238 | 1630* | C | 1580 | — |
| Example 34 | 1A2 | Atomizing ↓ | 43 | 580 | 1225 | 1532* | B | 1550 | — |
| Example 35 | 1A3 | laminating shaping | 30 | 530 | 1115 | 1476 | B | 1450 | — |
| Example 36 | IA 4 | | 20 | 317 | 639 | 1041 | A | 1300 | 1.28 |
| Example 1 | IA 1 | Mixing/melting/casting ↓ | 84 | 564 | 1125 | 1482* | C | 1556 | — |
| Example 3 | IA 2 | Hot forging ↓ | 68 | 483 | 1114 | 1393* | C | 1521 | — |
| Example 5 | IA 3 | Solution heat treatment | 43 | 442 | 1014 | 1342* | B | 1428 | — |
| Example 9 | IA 4 | | 16 | 264 | 581 | 946 | A | 1250 | 1.53 |

"*" indicates elongation at break.
"—" indicates that the test was not conducted.

FIG. 8A is an optical microscope photograph showing a metal microstructure of Example 9, and FIG. 8B is an optical microscope photograph showing a metal microstructure of Example 36. Since hot forging was conducted in Example 9, it is confirmed that the two-phase alloy has a microstructure in which a dendrite, which is inherent to a cast solidified microstructure, has been broken, and crystal grains in which equi-axed crystals are seen in at least a part (so-called a forged microstructure) as in Example 5 in FIG. 1. On the other hand, in Example 36, the respective crystal grains in the α phase and γ phase are small and dispersed more evenly, and crystal grains having a shape like an early stage of a dendrite are seen. Therefore, it is confirmed that Example 36 has a quench-solidified microstructure.

Regarding the microstructure stability (property to suppress the generation of a σ phase), as a result of the investigation (the heat treatment by holding at 800° C. for 60 minutes, and the X-ray diffraction measurement), it is confirmed that any σ phase was not detected and thus a σ phase is difficult to be formed in either of Examples 33 to 36.

As shown in Table 5, Examples 33 to 36 have ferrite ratios that are different from those of Examples 1, 3, 5 and 9 respectively having the same alloy compositions, and also exhibit higher mechanical strengths (Vickers hardness, 0.2% yield strength, and tensile strength) and ductility that is equivalent or more than those of Examples 1, 3, 5 and 9. It is considered that the miniaturization micronization of the crystal grains by quenching solidification and the homogeneous dispersion of the α phase and γ phase are strongly related in these results.

As a result of the investigation of the solid-liquid distribution coefficients on Examples 36 and 9, the coefficient is 1.53 in Example 9, whereas the coefficient decreases to 1.28 in Example 36. This result means that the difference in the Cr concentration in the γ phase and the Cr concentration in the α phase in Example 36 becomes smaller than that in Example 9, and thus serves as a collateral evidence showing that Example 36 was prepared by quenching solidification.

Furthermore, as to the corrosion resistance, Examples 33 to 36 respectively have higher pitting generation potentials than those of the corresponding Examples. Although the specific mechanism of this result has not been clarified, it is considered that the decrease in the solid-liquid distribution coefficient (decrease in the difference in the Cr concentrations between the γ phase and the α phase) is involved in the mechanism.

FIG. 9 is a chart showing the change with time of the current density under potentiostatic polarization at 1,000 mV (vs. SHE) in Examples 9 and 36. As shown in FIG. 9, the current density decreases with increasing time in Example 36, and this means that the corrosion rate of Example 36 is lower than that of Example 9. That is, it is confirmed that Example 36 has a higher corrosion resistance than Example 9.

The above-described embodiments and Examples have been specifically given in order to help with understanding on the present invention, but the invention is not limited to the configuration equipped with all the components described above. For example, some of the configurations of a certain embodiment may be replaced with the configurations of the other embodiments, and the configurations of the other embodiments may be added to the configurations of the subject embodiment. Furthermore, some of the configurations of each embodiment may be omitted, replaced with other configurations, and added to other configurations.

LEGEND

P1 . . . austenite phase;
P2 . . . ferrite phase;
10 . . . molten metal;
20 . . . ingot;
30 . . . shaped body;
40 . . . alloy powder;
50 . . . composite;
51 . . . substrate;
52 . . . two-phase alloy coating layer;
60 . . . quench-solidified microstructure;
61 . . . melting boundary;
62 . . . solidified layer;
65 . . . columnar crystal;
66 . . . large tilt angle grain boundary;
67 . . . small tilt angle grain boundary;
70 . . . wire;
80 . . . welded joint;
81 . . . alloy member; and
82 . . . welded part.

The invention claimed is:

1. A two-phase alloy comprising Cr as a major component and comprising two phases of a ferrite phase and an austenite phase in a mixed state,
    wherein the two-phase alloy has a chemical composition comprising:
        34% by mass or more and 70% by mass or less of Cr;
        17% by mass or more and 45% by mass or less of Ni;
        10% by mass or more and 35% by mass or less of Fe;
        0.1% by mass or more and 2% by mass or less of Mn;
        0.1% by mass or more and 1% by mass or less of Si; and
        impurities, wherein the impurities comprises:
            more than 0% by mass and 0.03% by mass or less of C;
            more than 0% by mass and 0.02% by mass or less of N;
            more than 0% by mass and 0.03% by mass or less of O; and
            wherein the chemical composition further comprises at least one of V, Ta and Ti as the constitutional component(s) of the two-phase alloy, the total content of the V, Ta and Ti being in the range of 0.8 times or more and 2 times or less of the total content of the C, N and O, and
    the total content of the Ni and the Fe is 30% by mass or more and 65% by mass or less.

2. The two-phase alloy according to claim 1,
    wherein the constitutional component(s) of the two-phase alloy further the total content of the V, Nb, Ta and Ti being in the range of 0.8 times or more and 2 times or less of the total content of the C, N and O.

3. The two-phase alloy according to claim 1,
    wherein the impurities further comprise:
    more than 0% by mass and 0.04% by mass or less of P; and
    more than 0% by mass and 0.01% by mass or less of S.

4. The two-phase alloy according to claim 1, wherein the ferrite phase has an occupation ratio of 10% or more and 90% or less.

5. A product comprising a two-phase alloy, wherein the two-phase alloy is the two-phase alloy according to claim 1.

6. The two-phase alloy product according to claim 5, wherein the product is a shaped body having a forged microstructure.

7. The two-phase alloy product according to claim 6, wherein the product is a shaft or a bearing of a rotary machine.

8. The two-phase alloy product according to claim 5, wherein the product is a composite having a substrate and a coating layer of the two-phase alloy formed on the substrate.

9. The two-phase alloy product according to claim 8, wherein the ratio of an average Cr concentration in the austenite phase to an average Cr concentration of the ferrite phase in the coating layer is 1.3 or less.

10. The two-phase alloy product according to claim 8, wherein the coating layer has a quench-solidified microstructure.

11. The two-phase alloy product according to claim 5, wherein the product is a powder.

12. The two-phase alloy product according to claim 11, wherein the product is a welding material.

13. The two-phase alloy product according to claim 5, wherein the product is a rod or a wire.

14. The two-phase alloy product according to claim 5, wherein the product is a welded joint having alloy members that are welded through a welded part, and the welded part is formed of the two-phase alloy.

15. The two-phase alloy product according to claim 14, wherein the ratio of an average Cr concentration in the austenite phase to an average Cr concentration of the ferrite phase in the welded part is 1.3 or less.

16. The two-phase alloy product according to claim 14, wherein the alloy members are formed of the two-phase alloy.

17. A method for producing the two-phase alloy product according to claim 5, comprising:
   a step of mixing and melting raw materials, in which raw materials of the two-phase alloy are mixed and melted;
   a casting step, in which an ingot is formed by casting;
   a hot forging step, in which the ingot is subjected to hot forging to form a shaped body; and
   a solution heat treatment step, in which the shaped body is subjected to a solution treatment within a temperature range of 1,050° C. or more and 1,250° C. or less.

18. The method for producing the two-phase alloy product according to claim 17, which further comprises, after the solution heat treatment step, an aging heat treatment step, in which the shaped body that has undergone the solution treatment is subjected to an aging treatment within a temperature range of 800° C. or more and 1,000° C. or less.

19. A method for producing the two-phase alloy product according to claim 8, comprising:
   a step of mixing and melting raw materials, in which raw materials of the two-phase alloy are mixed and melted to form a molten metal;
   an atomizing step, in which an alloy powder is formed from the molten metal; and
   a laminating shaping step, in which a coating layer of the two-phase alloy is formed on the substrate by using the alloy powder.

20. A method for producing the two-phase alloy product according to claim 14, comprising:
   a step of mixing and melting raw materials, in which raw materials of the two-phase alloy are mixed and melted;
   a casting step for forming an ingot by casting;
   a hot working step, in which the ingot is subjected to hot working to form a rod or a wire; and
   a welding step, in which the alloy members are welded by using the rod or the wire as a welding material.

* * * * *